US011107899B2

(12) United States Patent
Cheng et al.

(10) Patent No.: US 11,107,899 B2
(45) Date of Patent: Aug. 31, 2021

(54) PLATE DESIGN TO DECREASE NOISE IN SEMICONDUCTOR DEVICES

(71) Applicant: Taiwan Semiconductor Manufacturing Co., Ltd., Hsin-Chu (TW)

(72) Inventors: Chih-Chang Cheng, Hsinchu (TW); Fu-Yu Chu, Hsinchu (TW); Ming-Ta Lei, Hsin-Chu (TW); Ruey-Hsin Liu, Hsin-Chu (TW); Shih-Fen Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/837,401

(22) Filed: Apr. 1, 2020

(65) Prior Publication Data

US 2020/0227528 A1 Jul. 16, 2020

Related U.S. Application Data

(63) Continuation of application No. 15/800,474, filed on Nov. 1, 2017, now Pat. No. 10,658,482.

(51) Int. Cl.
*H01L 29/78* (2006.01)
*H01L 29/423* (2006.01)
(Continued)

(52) U.S. Cl.
CPC .... *H01L 29/4238* (2013.01); *H01L 21/26513* (2013.01); *H01L 21/28123* (2013.01);
(Continued)

(58) Field of Classification Search
CPC ............. H01L 29/4238; H01L 29/0653; H01L 29/0847; H01L 29/78; H01L 29/4916; H01L 21/26513; H01L 21/28123
See application file for complete search history.

(56) References Cited

U.S. PATENT DOCUMENTS 8,716,768 B2 * 5/2014 Lyu .................... H01L 29/6659
257/291
9,190,536 B1 11/2015 Chan et al.
(Continued)

OTHER PUBLICATIONS

Kwon, et al. "Effects of Shallow Trench Isolation on Low Frequency Noise Characteristics of Source-Follower Transistors in CMOS Image Sensors." Solid-State Electronics 119 (2016) 29-32, published Mar. 1, 2016.
(Continued)

*Primary Examiner* — Timor Karimy
(74) *Attorney, Agent, or Firm* — Eschweiler & Potashnik, LLC

(57) ABSTRACT

A semiconductor device and method for forming the semiconductor device are provided. In some embodiments, a semiconductor substrate comprises a device region. An isolation structure extends laterally in a closed path to demarcate the device region. A first source/drain region and a second source/drain region are in the device region and laterally spaced. A sidewall of the first source/drain region directly contacts the isolation structure at a first isolation structure sidewall, and remaining sidewalls of the first source/drain region are spaced from the isolation structure. A selectively-conductive channel is in the device region, and extends laterally from the first source/drain region to the second source/drain region. A plate comprises a central portion and a first peripheral portion. The central portion overlies the selectively-conductive channel, and the first peripheral portion protrudes from the central portion towards the first isolation structure sidewall.

20 Claims, 24 Drawing Sheets

(51) Int. Cl.

| | |
|---|---|
| ***H01L 21/265*** | (2006.01) |
| ***H01L 21/28*** | (2006.01) |
| ***H01L 29/06*** | (2006.01) |
| ***H01L 29/08*** | (2006.01) |
| *H01L 29/49* | (2006.01) |

(52) U.S. Cl.

CPC ...... *H01L 29/0653* (2013.01); *H01L 29/0847* (2013.01); *H01L 29/78* (2013.01); *H01L 29/4916* (2013.01)

(56) References Cited

U.S. PATENT DOCUMENTS

| | | | |
|---|---|---|---|
| 10,164,033 | B2 | 12/2018 | Yeo et al. |
| 2006/0192258 | A1 | 8/2006 | Tsuchiya et al. |
| 2009/0224335 | A1 | 9/2009 | Chang |
| 2010/0315115 | A1 | 12/2010 | Lee et al. |
| 2012/0074498 | A1 | 3/2012 | Chuang |
| 2013/0154023 | A1 | 6/2013 | Yoshida et al. |
| 2013/0334614 | A1 | 12/2013 | Liaw |
| 2014/0042506 | A1 | 2/2014 | Ramberg et al. |
| 2015/0200249 | A1 | 7/2015 | Kundu |
| 2017/0235795 | A1 | 8/2017 | Gilder |
| 2017/0294356 | A1 | 10/2017 | Yeh et al. |
| 2019/0088780 | A1 | 3/2019 | Choi et al. |

OTHER PUBLICATIONS

Chan, et al. "STI Effect on Flicker Noise in 0.13-μm RF NMOS." Proceeding of the 36th European IEEE Solid-State Device Research Conference, 2006. ESSDERC 2006. Published Feb. 12, 2007.

U.S. Appl. No. 15/257,291, filed Sep. 6, 2016.

U.S. Appl. No. 15/688,018, filed Aug. 28, 2017.

Non-Final Office Action dated Jun. 2, 2017 for U.S. Appl. No. 15/257,291.

Notice of Allowance dated Nov. 3, 2017 for U.S. Appl. No. 15/257,291.

Non-Final Office Action dated Jul. 10, 2018 for U.S. Appl. No. 15/688,018.

Final Office Action dated Jan. 30, 2019 for U.S. Appl. No. 15/688,018.

Carmonai, M, Hubert, L. Lopezi, F. Julieni, J., Ogieri, D. Goguenheim, and L. Beauvisagei Study of gate contact over active area, 2014 29th Symposium on Microelectronics Technology and Devices (SBMicro), Aracaju, 2014, pp. 1-4. (Year: 2014).

U.S. Appl. No. 16/363,114, filed Mar. 25, 2019.

Non-Final Office Action dated Aug. 20, 2019 in connection with U.S. Appl. No. 15/688,018.

Notice of Allowance dated Feb. 13, 2020 in connection with U.S. Appl. No. 15/688,018.

Non-Final Office Action dated Oct. 24, 2019 for U.S. Appl. No. 15/800,474.

Notice of Allowance dated Jan. 15, 2020 for U.S. Appl. No. 15/800,474.

* cited by examiner

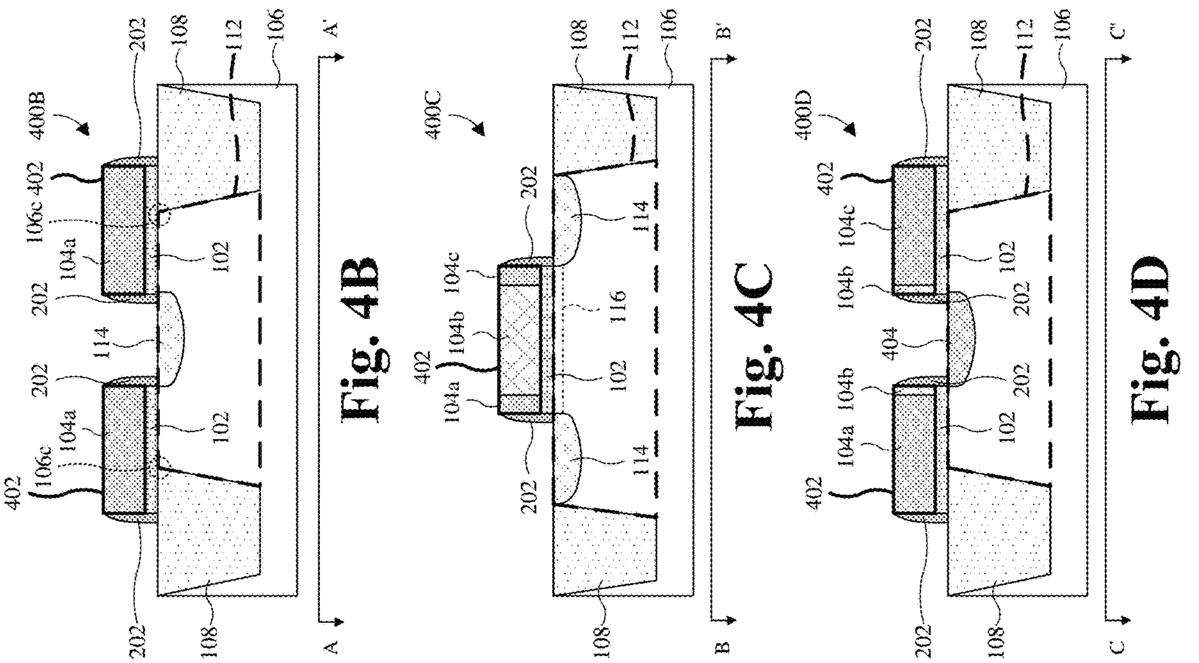
Fig. 4B
Fig. 4C
Fig. 4D
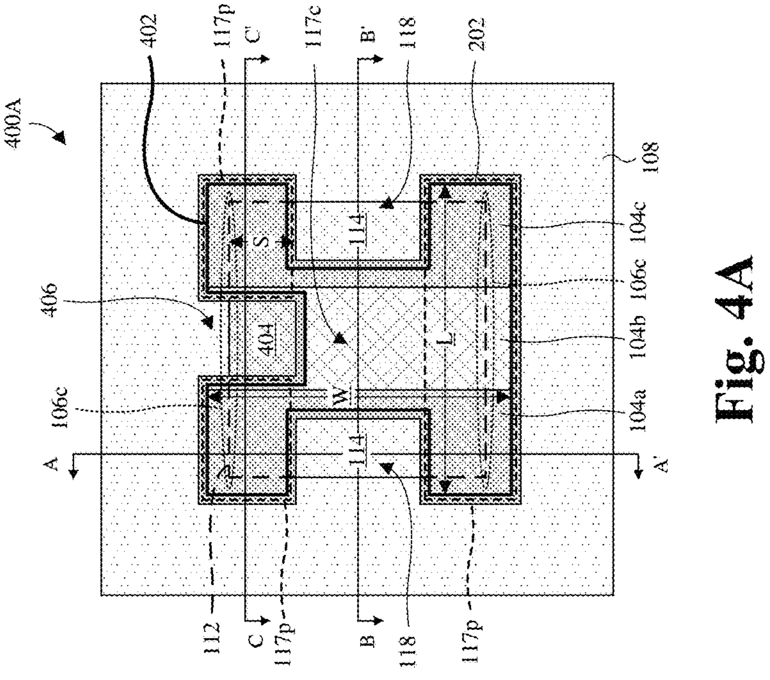
Fig. 4A

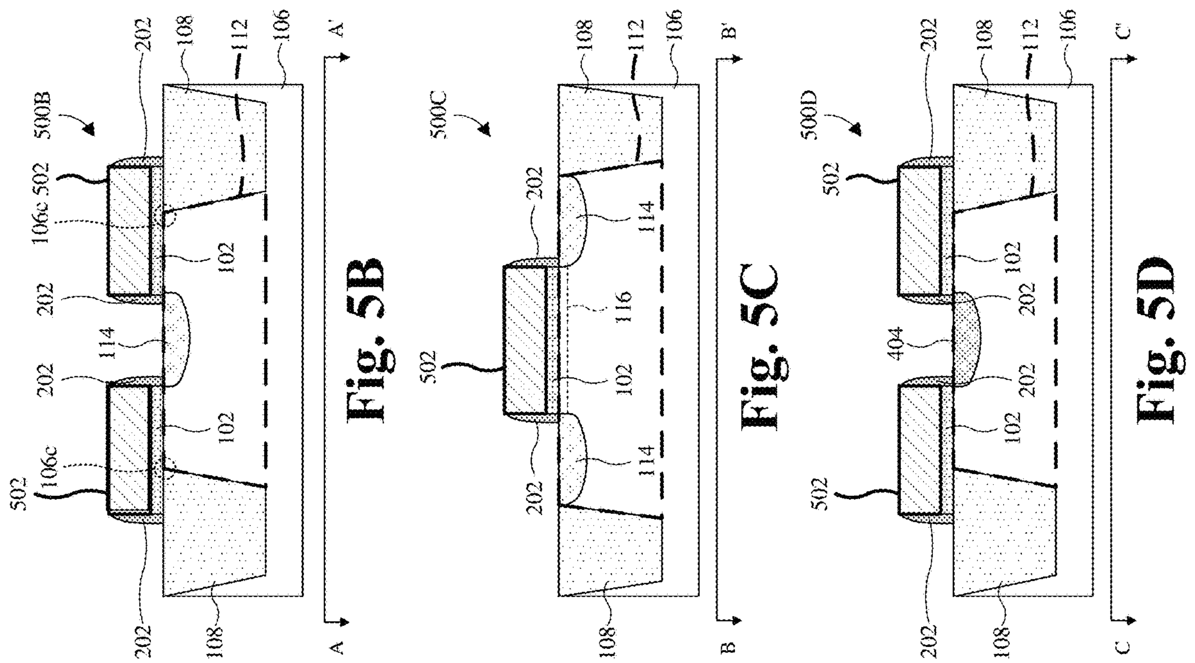
500B
502
106c
202
114
102
108
112
106
A
A'
Fig. 5B
500C
116
B
B'
Fig. 5C
500D
404
C
C'
Fig. 5D
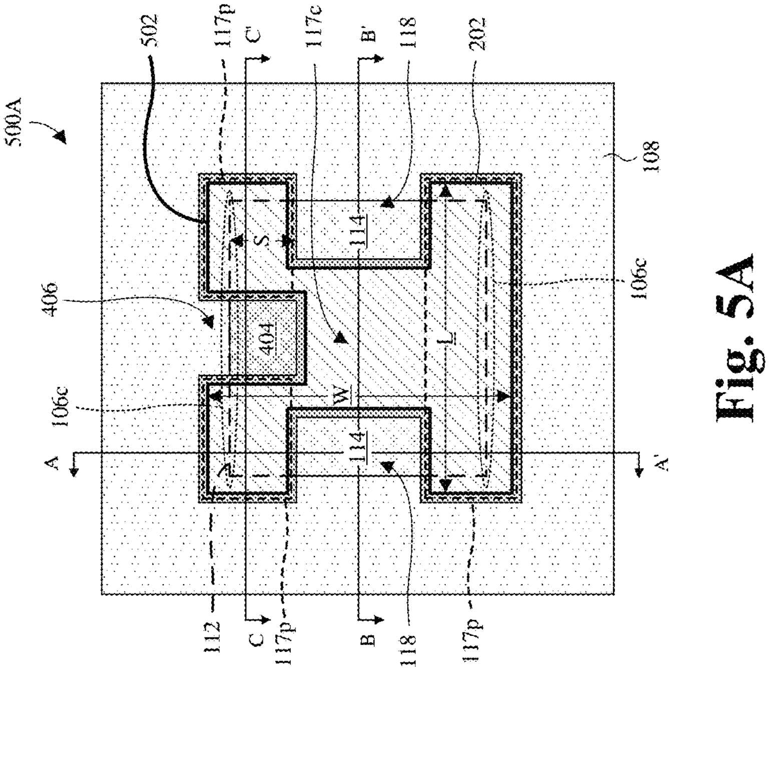
500A
406
404
106c
502
117p
117c
118
202
108
114
S
W
L
112
A
A'
B
B'
C
C'
Fig. 5A

PLATE DESIGN TO DECREASE NOISE IN SEMICONDUCTOR DEVICES

REFERENCE TO RELATED APPLICATION

This application is a Continuation of U.S. application Ser. No. 15/800,474, filed on Nov. 1, 2017, the contents of which are hereby incorporated by reference in their entirety.

BACKGROUND

Semiconductor devices are electronic components that exploit electronic properties of semiconductor materials to affect electrons or their associated fields. A widely used type of semiconductor device is a field-effect transistor (FET). A FET comprises a pair of source/drain regions, a selectively-conductive channel, and a gate electrode. FETs are versatile devices that may be used for, among other things, switches, amplifiers, and memory. Examples of FETs include metal-oxide-semiconductor field-effect transistors (MOSFETs) and junction gate field-effect transistors (JFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4D through 7A-7D illustrate various views of various more detailed embodiments of the FET of FIGS. 1A-1C in which the FET is a junction gate FET (JFET).

DETAILED DESCRIPTION

Figure 1A:
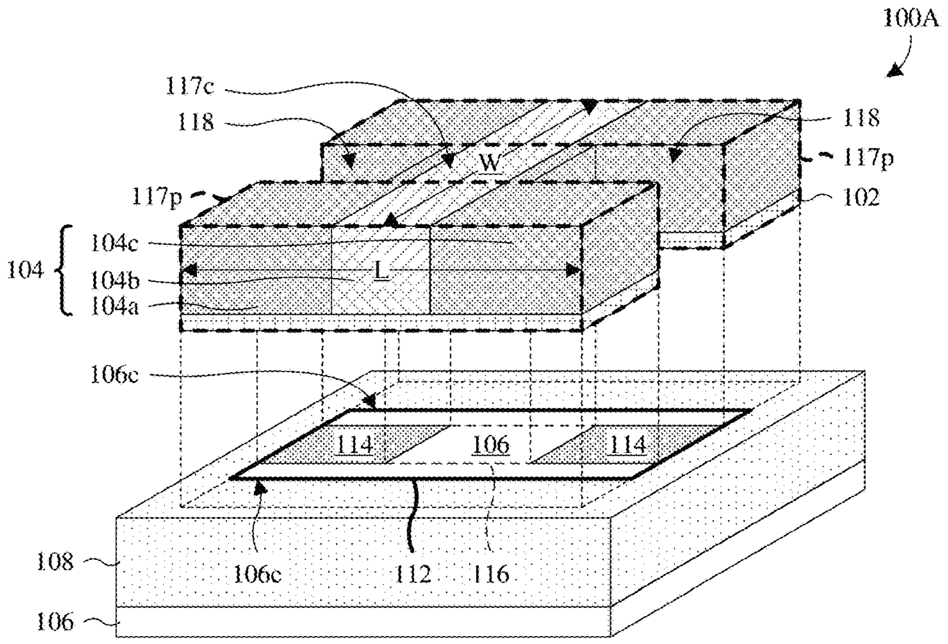
FIGS. 1A-1D illustrate various perspective views of some embodiments of a field-effect transistor (FET) with low flicker and random telegraph noise.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some field-effect transistors (FETs) comprise a semiconductor substrate and a shallow trench isolation (STI) structure. The STI structure is over and sunken into the semiconductor substrate to demarcate a device region of the semiconductor substrate. Further, the FET comprises a pair of source/drain regions, a selectively-conductive channel, a gate dielectric layer, and a gate electrode. The source/drain regions are laterally spaced, and are over and recessed into the device region of the semiconductor substrate. The selectively-conductive channel is in the device region of the semiconductor substrate and extends from one of the source/drain regions to another one of the source/drain regions. The gate dielectric layer overlies the selectively-conductive channel, and the gate electrode overlies the gate dielectric layer.

A challenge with the above FETs is flicker noise and random telegraph noise (RTN). One source of flicker and random telegraph noise is defect states at an interface between the gate dielectric layer and the device region of the semiconductor substrate. As current flows through the selectively-conductive channel, carriers are trapped and de-trapped by the defect states, thereby generating the flicker and random telegraph noise. The trapping and de-trapping occurs at a central portion of the selectively-conductive channel that interfaces with the gate dielectric layer. Further, the trapping and de-trapping occurs at a pair of STI corners at peripheral portions of the selectively-conductive channel. The STI corners are top cross-sectional corners of the semiconductor substrate that interface with the gate dielectric layer and the STI structure in the device region of the semiconductor substrate. Further, the STI corners are respectively on opposite sides of the selectively-conductive channel, and each extends laterally along a length of the selectively-conductive channel from one of the source/drain regions to another one of the source/drain regions. The STI corners have a high amount of defect states because the STI corners have high mechanical stress and are not defined by perfectly planar surfaces. Further, electric fields are strong at the STI corners because the STI corners have small radiuses of curvature. This, in turn, leads to high trapping and high de-trapping at the STI corners.

A partial solution to the challenge is to move the source/drain regions from the STI corners using a photoresist mask. For example, a photoresist mask may be formed on the device region of the semiconductor with a pair of source/drain openings that overlap the device region and that are spaced from the STI corners. Ion implantation may then be performed into the device region of semiconductor substrate, through the photoresist mask, to form the source/drain regions spaced from the STI corners. By spacing the source/drain regions from the STI corners, current flow along the STI corners is reduced, thereby reducing flicker and random telegraph noise generated at the STI corners. However, the partial solution does not address flicker and random telegraph noise generated by current flow along the central portion of the selectively-conductive channel. Further, using the photoresist mask to move the source/drain regions leads to poor performance uniformity during bulk manufacture, and leads to challenges during silicide formation. For example, it may be challenging to prevent silicide from forming on the device region, directly between the source/drains and the STI corners.

In view of the foregoing, various embodiments of the present application are directed toward a FET comprising a plate design that reduces noise, as well as method for forming the FET. In some embodiments, the FET comprises a semiconductor substrate, an isolation structure, a first source/drain region, a second source/drain region, a selectively-conductive channel, and a plate. The semiconductor substrate comprises a device region. The isolation structure extends laterally in a closed path to demarcate the device region. The first source/drain region and the second source/drain region are in the device region and are laterally spaced. A sidewall of the first source/drain region directly contacts the isolation structure at a first isolation structure sidewall, and remaining sidewalls of the first source/drain region are spaced from the isolation structure. A sidewall of the second source/drain region directly contacts the isolation structure at a second isolation structure sidewall, and remaining sidewalls of the second source/drain region are spaced from the isolation structure. The selectively-conductive channel is in the device region, and extends laterally from the first source/drain region to the second source/drain region. The plate comprises a central portion and a first peripheral portion. The central portion overlies the selectively-conductive channel, and the first peripheral portion protrudes from the central portion towards the first isolation structure sidewall.

During formation of the FET, ion implantation may be performed into the semiconductor substrate with the plate in place, such that the plate serves as a mask and the source/drain regions are self-aligned to the plate. Therefore, the planar top layout of the plate facilitates formation of the source/drain regions with the remaining sidewalls spaced from the isolation structure. As a result of the spacing, the source/drain regions are spaced from defect states at STI corners extending from the first isolation structure sidewall to the second isolation structure sidewall. This reduces source-drain current floating along the STI corners, which reduces carriers becoming trapped and de-trapped by defects states at the STI corners. Accordingly, flicker and random telegraph noise is reduced.

In some embodiments, the plate further comprises doped regions varying the work function of the plate, thereby pushing source-drain current deeper into the device region of the semiconductor substrate. Accordingly, less current flows along the top surface of the device region of the semiconductor substrate, thereby reducing charge carriers becoming trapped and de-trapped by defect states at a top surface. This, in turn, reduces flicker and random telegraph noise generated by the defect states.

Figure 1B:
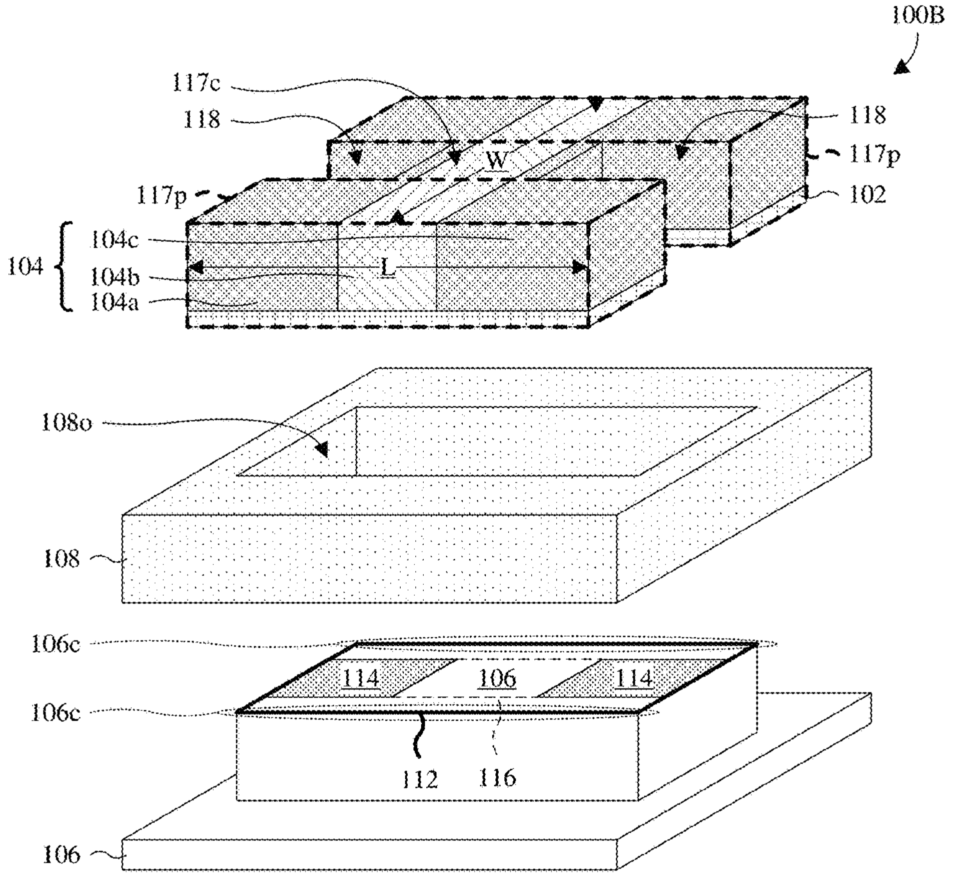
Figure 1C:
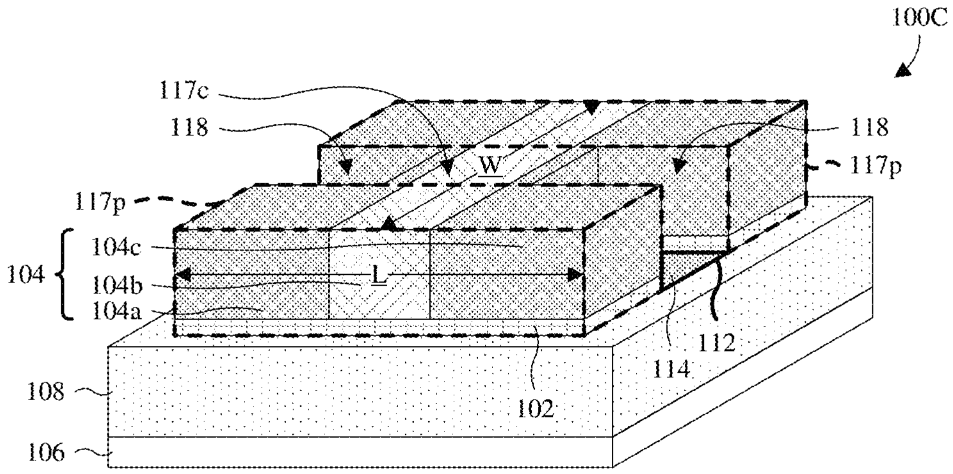
Figure 1D:
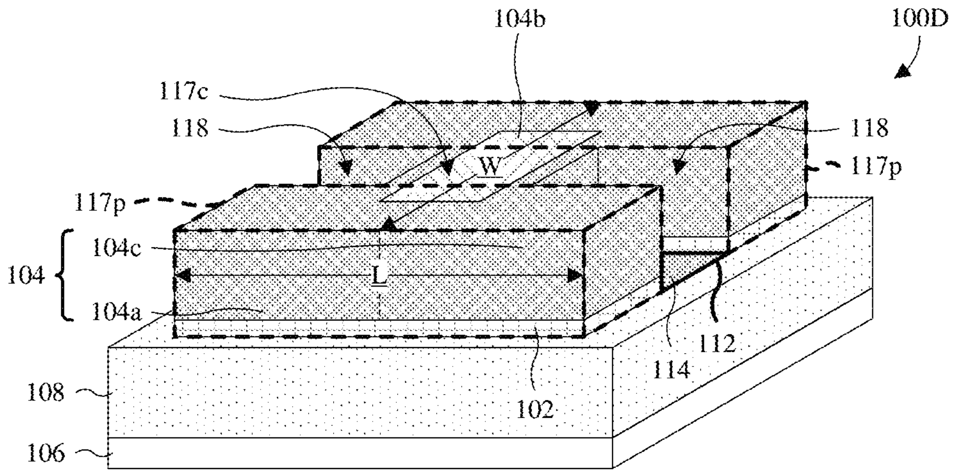

With reference to FIGS. 1A-1D, various perspective views 100A-100C of some embodiments of a FET with low flicker and random telegraph noise is provided. FIG. 1A is a deconstructed perspective view 100A of the FET, FIG. 1B is another deconstructed perspective view 100B of the FET, FIG. 1C is a constructed perspective view 100C of the FET, and FIG. 1D is a constructed perspective view 110D of an alternative embodiment of the FET. FIG. 1A is "deconstructed" in that a plate dielectric layer 102 (also called a gate dielectric layer in MOSFETs) and a plate 104 (also called a gate in MOSFETs) are separated from a semiconductor substrate 106 and an isolation structure 108 on which the plate dielectric layer 102 and the plate 104 normally rest. FIG. 1B is "deconstructed" in the same manner as FIG. 1A, except the isolation structure 108 is further separated from the semiconductor substrate 106 on which the isolation structure 108 normally rests. The FET may be, for example, a metal-oxide-semiconductor field-effect transistor (MOSFET) or a junction gate field-effect transistor (JFET).

As illustrated, the isolation structure 108 is over and extends into the semiconductor substrate 106 to delineate a device region 112 of the semiconductor substrate 106. In some embodiments, the isolation structure 108 has a generally ring-shaped layout, and/or defines a device-region opening **108*o* (see FIG. 1B) filled by the device region 112. A "generally" ring-shaped layout is similar to a ring-shaped layout, except it is not limited to circular inner and outer sidewalls. For example, a generally ring-shaped layout may be a square ring-shaped layout. The isolation structure 108 may be, for example, a STI region or a deep trench isolation (DTI) region. The semiconductor substrate 106** may be, for example, a bulk semiconductor substrate, such as a bulk silicon substrate of monocrystalline silicon.

A pair of source/drain regions 114 is over and in the device region 112, and the source/drain regions 114 are laterally spaced. Further, the source/drain regions 114 are respectively on a first end of the device region 112 and a second end of the device region 112 opposite the first end. A selectively-conductive channel 116 is defined by a bulk of the device region 112, laterally between the source/drain regions 114. Further, the selectively-conductive channel 116 extends from one of the source/drain regions 114 to another one of the source/drain regions 114, along a top surface of the device region 112. In some embodiments where the FET is a MOSFET, the source/drain regions 114 and the bulk of the device region 112 are doped regions of the semiconductor substrate 106 having opposite doping types. For example, the device region 112 may be p-type and the source/drain regions 114 may be n-type, or vice versa. In some embodiments where the FET is a JFET, the source/drain regions 114 have the same doping type as the bulk of the device region 112, and further have a higher doping concentration than the bulk of the device region 112. Further, the source/drain regions 114 are each spaced from and laterally between two isolation corners **106*c***.

The isolation corners **106*c* are top cross-sectional corners of the semiconductor substrate 106 that are in the device region 112 and that border the isolation structure 108. Further, the isolation corners 106*c* are line shaped and extend laterally in parallel with the selectively-conductive channel 116, from the first end of the device region 112 to the second end of the device region 112. In some embodiments, the isolation corners 106*c* have the same lengths or have substantially the same lengths. Further yet, the isolation corners 106*c* are on opposite sides of the device region 112, such that the source/drain regions 114 are each directly between the isolation corners 106*c*. In some embodiments, the isolation corners 106*c* are each at a location at which a top surface edge of the device region 112 meets a sidewall surface edge of the device region 112, where the sidewall surface of the sidewall surface edge borders and/or adjoins the isolation structure 108. Further, in some embodiments, the isolation corners 106***c* directly contact the plate dielectric layer 102.

By spacing the source/drain regions 114 from the isolation corners 106*c*, the flicker and random telegraph noise of the FET is reduced. Namely, the spacing increases the resistance from the source/drain regions 114 to the isolation corners 106*c*, such that a low amount of source-drain current flows through the isolation corners 106*c*. This, in turn, reduces carriers being trapped and de-trapped at the isolation corners 106*c*, thereby resulting in low flicker and random telegraph noise. As noted above, the isolation corners 106*c* have a high amount of defect states because the isolation corners 106*c* have high mechanical stress and are not defined by perfectly planar surfaces. Further, as noted above, the isolation corners 106*c* have small radiuses of curvature that promote high electric fields.

The plate dielectric layer 102 and the plate 104 are stacked, such that the plate 104 overlies the plate dielectric layer 102. Further, the plate dielectric layer 102 and the plate 104 overlie the device region 112 of the semiconductor substrate 106, as well as the isolation corners 106*c*. The plate 104 and, in some embodiments, the plate dielectric layer 102 comprise peripheral plate portions 117*p* that protrude from a central plate portion 117*c*. The peripheral plate portions 117*p* respectively cover the isolation corners 106*c*, and extend laterally in parallel with the isolation corners 106*c* and the selectively-conductive channel 116. The central plate portion 117*c* covers the selectively-conductive channel 116, and extends laterally from one of the peripheral plate portions 117*p* to another one of the peripheral plate portions 117*p*.

In some embodiments, the plate dielectric layer 102 and the plate 104 completely cover the isolation corners 106*c*. Further, in some embodiments, the plate dielectric layer 102 and the plate 104 have the same layout, and/or sidewalls of the plate dielectric layer 102 are aligned to sidewalls of the plate 104. Further yet, in some embodiments, the plate dielectric layer 102 and/or the plate 104 each have an H-shaped top layout. Further yet, the plate dielectric layer 102 and/or the plate 104 have a width W that is substantially perpendicular to the isolation corners 106*c*, and have a length L that is substantially parallel to the isolation corners 106*c*. The plate dielectric layer 102 may be, for example, silicon dioxide, silicon nitride, a high κ dielectric, some other dielectric, or any combination of the foregoing. As used herein, a high κ dielectric layer is a dielectric with a dielectric constant κ greater than about 3.9, 5, 10, 15, or 20. The plate 104 may be, for example, doped polysilicon, metal, or some other conductive material.

In some embodiments, the plate 104 comprises a first doped region 104*a*, a second doped region 104*b*, and a third doped region 104*c*. The first doped region 104*a* and the third doped region 104*c* have the same doping type and may, for example, also have the same doping type as the source/drain regions 114. The first doped region 104*a* and the third doped region 104*c* may, for example, be n-type or p-type. The second dope region 104*b* is disposed between the first doped region 104*a* and the third doped region 104*c* and comprises a second doping type opposite the first doping type. For example, in an n-channel MOSFET, the first doped region 104*a* and the third doped region 104*c* comprise n-type doped polysilicon and the second doped region 104*b* comprises p-type doped polysilicon. As another example, in a p-channel MOSFET, the first doped region 104*a* and the third doped region 104*c* comprise p-type doped polysilicon and the second doped region 104*b* comprises n-type doped polysilicon.

The second doped region 104*b* is within the central plate portion 117*c*, and extends laterally along the width W of the plate 104. In some embodiments, the second doped region 104*b* is limited to the central plate portion 117*c*. For example, the second doped region 104*b* may extend laterally along the width W of the plate 104 from one of the peripheral plate portions 117*p* to another one of the peripheral plate portions 117*p*, and may be sandwiched between the peripheral plate portions 117*p*. In other embodiments, the second doped region 104*b* is in both the central plate portion 117*c* and the peripheral plate portions 117*p*. For example, the second doped region 104*b* may extend laterally along the width W of the plate 104 from a sidewall of the plate 104 to another sidewall of the plate 104. In some embodiments, the second doped region 104*b* is spaced from sidewalls of the plate 104 overlying the selectively-conductive channel 116, and/or has a planar top layout that is line shaped.

The first doped region 104*a* and the third doped region 104*c* are within the peripheral plate portions 117*p*. In some embodiments, the first and third doped regions 104*a*, 104*c* are limited to the peripheral plate portions 117*p*. In other embodiments, the first and third doped regions 104*a*, 104*c* are also in the central plate portion 117*c*. For example, the first doped region 104*a* and the third doped region 104*c* may each have a U-shaped top layout spanning the peripheral plate portions 117*p* and the central plate portion 117*c*. In some embodiments, the first doped region 104*a* and the third doped region 104*c* are separated by the second doped region 104*b*. As illustrated in FIG. 1D, in other embodiments, the first doped region 104*a* and the third doped region 104*c* directly abut in the peripheral plate portions 117*p*, and/or collectively extend laterally in a closed path to completely enclose the second doped region 104*b*.

By doping the first doped region 104*a* and the third doped region 104*c* with the same doping type as the source/drain regions 114 and the second doped region 104*b* with a different doping type, the flicker and random telegraph noise of the FET may be kept low. Namely, the arrangement and doping types of the first, second, and third doped regions 104*a*, 104*b*, 104*c* alters the work function of the plate 104 to drive source-drain current flow deeper into the semiconductor substrate 106, thereby moving the current flow away from defect states at an interface between the device region 112 of the semiconductor substrate 106 and the plate dielectric layer 102. This, in turn, reduces trapping and de-trapping of carriers at the defect states, which leads to low flicker and random telegraph noise.

A pair of lateral plate openings 118 is defined by the plate 104 and, in some embodiments, the plate dielectric layer 102. The lateral plate openings 118 extend vertically through the plate 104, from top to bottom, and extend laterally into sides of the plate 104. The lateral plate openings 118 are each laterally between and spaced from the isolation corners 106*c*. In some embodiments, the lateral plate openings 118 are at a width-wise center of the plate 104 (i.e., at a center of the width W of the plate 104). Further, the lateral plate openings 118 are respectively on opposite sides of the plate 104 and respectively overlie the source/drain regions 114. In some embodiments, the lateral plate openings 118 are laterally spaced along the length L of the plate 104. Further, in some embodiments, the lateral plate openings 118 each have a side that is open, and three sides defined by the plate 104 and, in some embodiments, the plate dielectric layer 102.

In some embodiments, by having the lateral plate openings 118 in the plate 104, and the peripheral plate portions 117*p* covering the isolation corners 106*c*, the plate 104 may be employed as a mask to form the source/drain regions 114 spaced from the isolation corners 106*c* in a planar top layout of the FET. This, in turn, allows a low cost, low complexity process for reducing flicker and random telegraph noise since the same photomask used to pattern the plate 104 may also be used to reduce flicker noise.

With reference to FIGS. 2A-2C and 3A-3C, various views of various more detailed embodiments of the FET of FIGS. 1A-1C are provided in which the FET is a MOSFET. Figures having a suffix of "A" (e.g., FIG. 2A) are top layout views of some embodiments of the MOSFET. Figures having a suffix of "B" (e.g., FIG. 3B) are cross-sectional views of some embodiments of the MOSFET, taken along line A-A' in the figures having a suffix of "A." Figures having a suffix of "C" (e.g., FIG. 2C) are cross-sectional views of some embodiments of the MOSFET, taken along line B-B' in the figures having a suffix of "A."

Figure 2B:
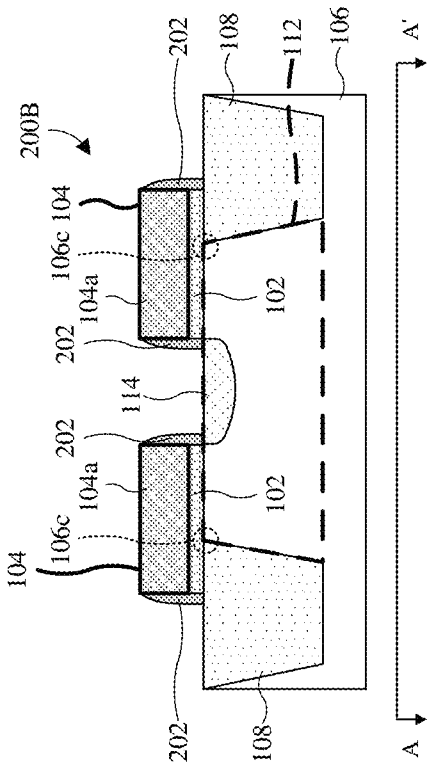
FIGS. 2A-2C and 3A-3C illustrate various views of various more detailed embodiments of the FET of FIGS. 1A-1C in which the FET is a metal-oxide-semiconductor FET (MOSFET).
Figure 2C:
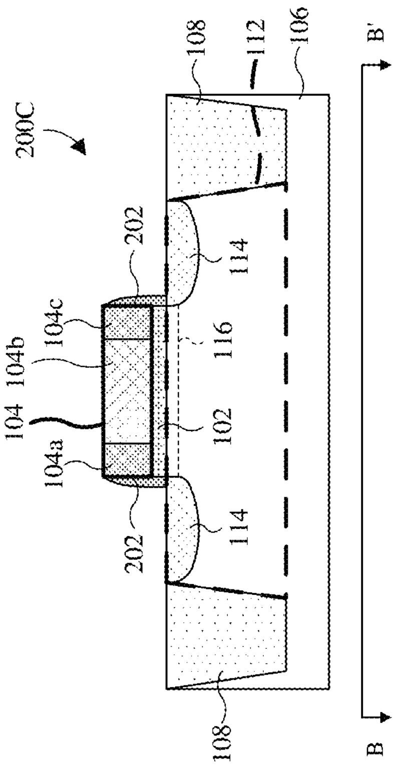
Figure 2A:
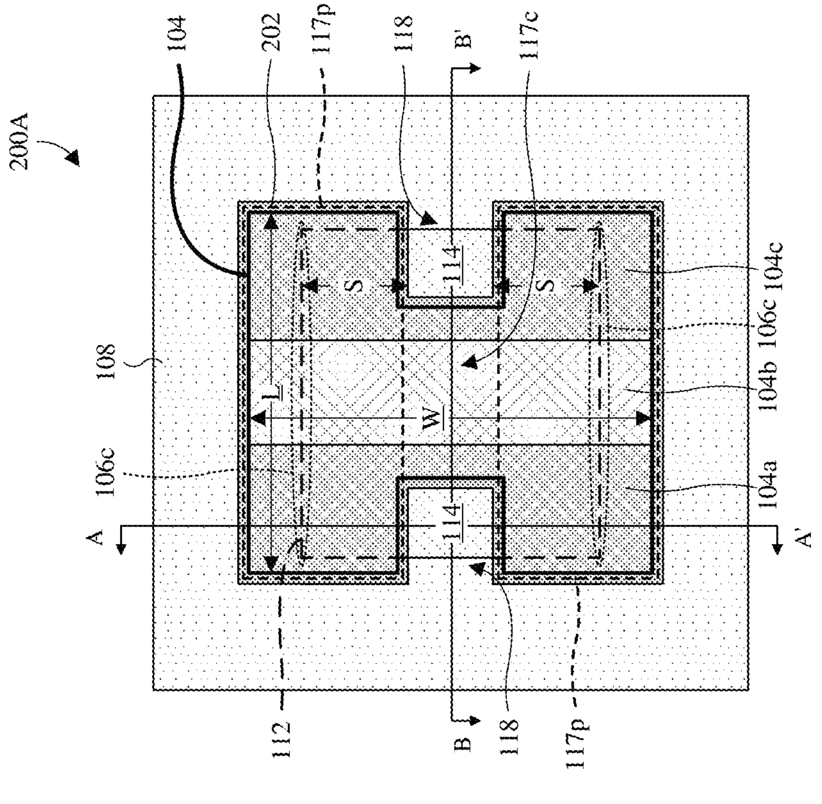

As illustrated by the views 200A-200C of FIGS. 2A-2C, a plate 104 overlaps the isolation corners 106*c* and is laterally between a pair of source/drain regions 114. A spacer 202 extends laterally along a boundary of the plate 104 to surround the plate 104. Further, the source/drain regions 114 are laterally spaced in a first direction, and are laterally spaced from the isolation corners 106*c* in a second direction perpendicular to or substantially perpendicular to the first direction. In some embodiments, the source/drain regions 114 are spaced from each of the isolation corners 106*c* by an amount S in the second direction (see FIG. 2B). As noted above, the FET has reduced flicker and random telegraph noise due this spacing. Further, in some embodiments, the plate 104 has a planar top layout that is H-shaped, and/or has at more than four sidewalls (e.g., 12 sidewalls). Further yet, in some embodiments, the plate 104 has a pair of peripheral plate portions 117*p* and a central plate portion 117*c*. The peripheral plate portions 117*p* respectively cover the isolation corners 106*c*, and the central plate portion 117*c* bridges the peripheral plate portions 117*p*.

A first doped region 104*a*, a second doped region 104*b*, and a third doped region 104*c* are within the central plate portion 117*c* and the peripheral plate portions 117*p*. The second dope region 104*b* is disposed between the first doped region 104*a* and the third doped region 104*c* and comprises a doping type opposite that of the first doped region 104*a* and the third doped region 104*c*. Further, the second doped region 104*b* extends laterally along a width W of the plate 104 (see FIG. 2A) from a first sidewall of the plate 104 to a second sidewall of the plate 104. The first doped region 104*a* and the third doped region 104*c* are respectively on opposite sides of the second doped region 104*b* and are laterally spaced by the second doped region 104*b* along a length L of the plate 104 (see FIG. 2A). Further, the first doped region 104*a* and the third doped region 104*c* each have a U-shaped planar top layout that wraps around a respective one of the source/drain regions 114 and that spaces the second doped region 104*b* from the respective one of the source/drain regions 114. Further yet, the first doped region 104*a* and the third doped region 104*c* have the same doping type and may, for example, also have the same doping type as the source/drain regions 114. As noted above, the FET has reduced flicker and random telegraph noise due to the arrangement and doping types of the first, second, and third doped regions 104*a*, 104*b*, 104*c* altering the work function of the plate 104 to drive current flow to a deeper portion of the semiconductor substrate 106.

Figure 3B:
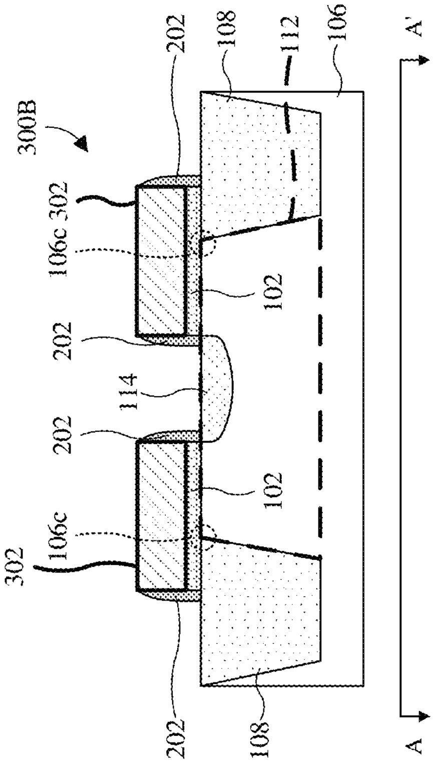
Figure 3C:
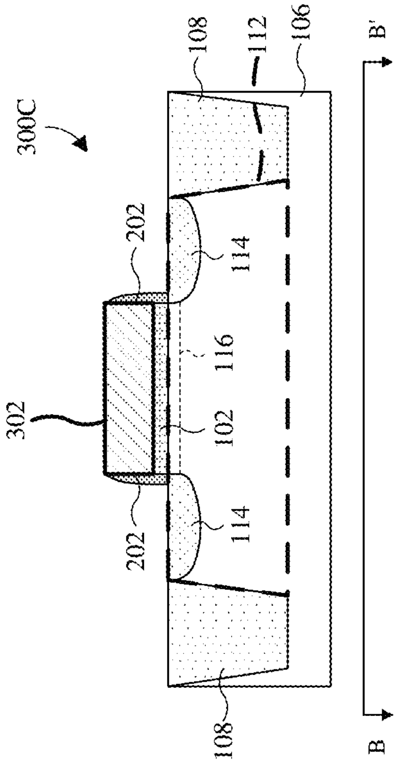
Figure 3A:
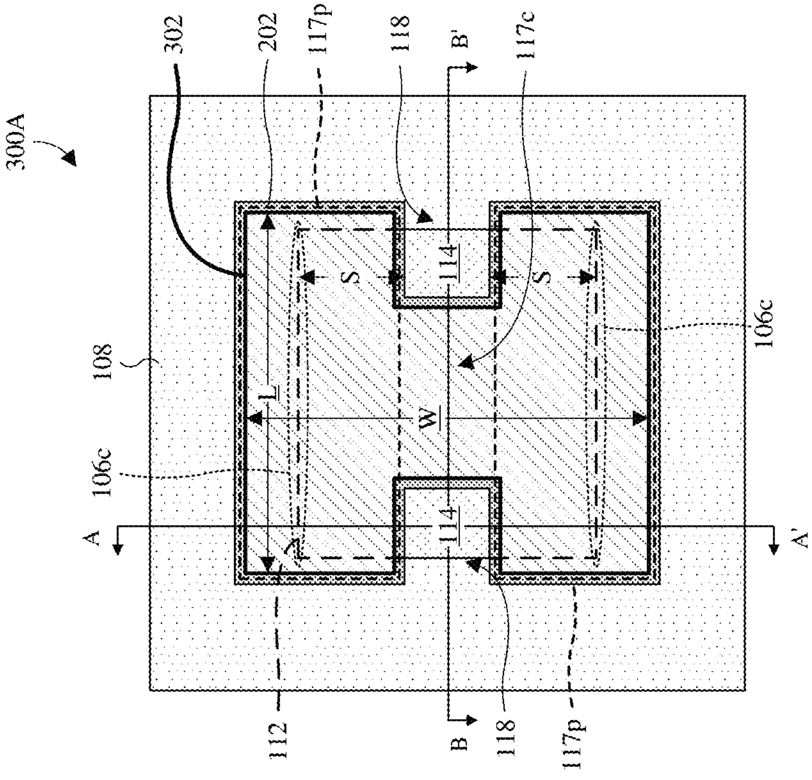

As illustrated by the views 300A-300C of FIGS. 3A-3C, a plate 302 overlaps the isolation corners 106*c* and is laterally between a pair of source/drain regions 114. The plate 302 is undoped or comprises a single doping type, such as, for example, n-type or p-type. In some embodiments where the FET is an n-channel MOSFET, the plate 302 comprises p-type doped polysilicon. In other embodiments, where the FET is a p-channel MOSFET, the plate 302 comprises n-type doped polysilicon. Further, the plate 302 may, for example, be as the plate 104 of FIGS. 2A-2C is described, except that the plate lacks the first, second, and third doped regions 104*a*, 104*b*, 104*c*.

With reference to FIGS. 4A-4D through 7A-7D, various views of various more detailed embodiments of the FET of FIGS. 1A-1C are provided in which the FET is a JFET. Figures having a suffix of "A" (e.g., FIG. 5A) are top layout views of some embodiments of the JFET. Figures having a suffix of "B" (e.g., FIG. 6B) are cross-sectional views of some embodiments of the JFET, taken along line A-A' in the figures having a suffix of "A." Figures having a suffix of "C" (e.g., FIG. 4C) are cross-sectional views of some embodiments of the JFET, taken along line B-B' in the figures having a suffix of "A." Figures having a suffix of "D" (e.g., FIG. 5D) are cross-sectional views of some embodiments of the JFET, taken along line C-C' in the figures having a suffix of "A."

As illustrated by the views 400A-400D of FIGS. 4A-4D, a plate 402 overlaps the isolation corners 106*c* and is laterally between a pair of source/drain regions 114. The plate 402 may be, for example, doped polysilicon, metal, or some other conductive material. The source/drain regions 114 are laterally spaced in a first direction, and are laterally spaced from and between the isolation corners 106*c* in a second direction perpendicular to or substantially perpendicular to the first direction. As noted above, the FET has reduced flicker and random telegraph noise due to this spacing. In some embodiments, the source/drain regions 114 have the same doping type, but a higher doping concentration, than a bulk of the device region 112. A gate region 404 is over and in the device region 112, and is laterally between the source/drain regions 114. Further, the gate region 404 is spaced from each of the source/drain regions 114 in the first direction. In other embodiments, the gate region 404 is not spaced from each of the source/drain regions 114 in the first direction. In some embodiments, a first side of the gate region 404 abuts the selectively-conductive channel 116 (See FIGS. 1A-1D and FIG. 4C), and a second side opposite the first side abuts the isolation structure 108 at one of the isolation corners 106*c*. The gate region 404 has an opposite doping type as the source/drain regions 114 and, in some embodiments, has an opposite doping type as the bulk of the device region 112. For example, the source/drain regions 114 may be n-type and the gate region 404 may be p-type, or vice versa.

The plate 402 comprises peripheral plate portions 117*p* that respectively cover the isolation corners 106*c*, and a central plate portion 117*c* that bridges the peripheral plate portions 117*p*. In some embodiments, the plate 402 has a concave polygonal layout comprising at least sixteen sides. Further, the plate 402 comprises a first doped region 104*a*, a second doped region 104*b*, and a third doped region 104*c*. The second doped region 104*b* is disposed within the central plate portion 117*c*, and in some embodiments, the second doped region 104*b*. The second doped region 104*b* extends laterally along the width W of the plate 402, into the peripheral plate portions 117*p*, to sidewalls of the plate 402. In some embodiments, the second doped region 104*b* separates the first doped region 104*a* and the third doped region 104*c* from the gate region 404. The second doped region 104*b* may, for example, have the same doping type as the gate region 404, and/or the first and third doped regions 104*a*, 104*c* may, for example, have an opposite doping type as the gate region 404. As noted above, the FET has reduced flicker and random telegraph noise due to the arrangement and doping types of the first, second, and third doped regions 104*a*, 104*b*, 104*c* altering the work function of the plate 402 to drive current flow into a deeper portion of the selectively-conductive channel 116 (see, FIGS. 1A-1D and FIG. 4C).

A lateral gate opening 406 is defined by the plate 402 and, in some embodiments, the plate dielectric layer 102. The lateral gate opening 406 extends vertically through the plate 402, from top to bottom, and extends laterally into a side of the plate 402. The lateral gate opening 406 is laterally spaced between the source/drain regions 114 and borders one of the isolation corners 106*c*. In some embodiments, the lateral gate opening 406 is at a length-wise center of the plate 402 (i.e., at a center of the length L of the plate 402). Further, the lateral gate opening 406 overlies the gate region 404. In some embodiments, the lateral gate opening 406 has a side that is open, and three sides defined by the plate 402 and, in some embodiments, the plate dielectric layer 102.

As illustrated by the views 500A-500D of FIGS. 5A-5D, a plate 502 overlaps the isolation corners 106*c* and is laterally between a pair of source/drain regions 114. The source/drain regions 114 are laterally spaced in a first direction, and the gate region 404 is laterally between and spaced from each source/drain region 114 in the first direction. The plate 502 is undoped or comprises a single doping type, such as, for example, n-type or p-type. In some embodiments, the plate 502 comprises doped polysilicon with the same doping type as the gate region 404.

As illustrated by the views 600A-600D of FIGS. 6A-6D, a plate 602 overlaps the isolation corners 106*c* and is laterally between a pair of source/drain regions 114. The plate 402 may be, for example, doped polysilicon, metal, or some other conductive material. The source/drain regions 114 are laterally spaced in a first direction, and are laterally spaced between the isolation corners 106*c* in a second direction perpendicular to or substantially perpendicular to the first direction. As noted above, the FET has reduced flicker and random telegraph noise due to the spacing between the isolation corners 106*c* and the source/drain regions 114. In some embodiments, the source/drain regions 114 have the same doping type, but a higher doping concentration, than a bulk of the device region 112. A pair of gate regions 604 is over and in the device region 112, and the gate regions 604 are laterally between a pair of source/drain regions 114. Further, the gate regions 604 are each spaced from the source/drain region 114 in the first direction, and are laterally spaced from each other in the second direction. In some embodiments, each of the gate regions 604 has a first side abutting the selectively-conductive channel 116 (See FIGS. 1A-1C and FIG. 6C), and a second side opposite the first side abutting the isolation structure 108 at a respective one of the isolation corners 106*c*. The gate regions 404 have the same doping type. Further, the gate regions 404 have an opposite doping type as the source/drain regions 114 and, in some embodiments, have an opposite doping type as the bulk of the device region 112.

The plate 602 comprises peripheral plate portions 117*p* that respectively cover the isolation corners 106*c*, and a central plate portion 117*c* that bridges the peripheral plate portions 117*p*. In some embodiments, the plate 602 has a polygonal-shaped layout comprising at least twenty sides. Further, the plate 602 comprises a first doped region 104*a*, a second doped region 104*b*, and a third doped region 104*c*. The second doped region 104*b* is disposed within the central plate portion 117*c* and extends laterally along the width W of the plate 602, into the peripheral plate portions 117*p*, to sidewalls of the plate 602. In some embodiments, the second doped region 104*b* separates the first doped region 104*a* and the third doped region 104*c* from each of the gate regions 604. The second doped region 104*b* may, for example, have the same doping type as the gate regions 404, and/or the first and third doped regions 104*a*, 104*c* may, for example, have an opposite doping type as the gate regions 404. As noted above, the FET has reduced flicker and random telegraph noise due to the arrangement and doping types of the first, second, and third doped regions 104*a*, 104*b*, 104*c* altering the work function of the plate 602 to drive current flow to a deeper portion of the selectively-conductive channel 116.

Figures 6A, 6B, 6C, 6D:
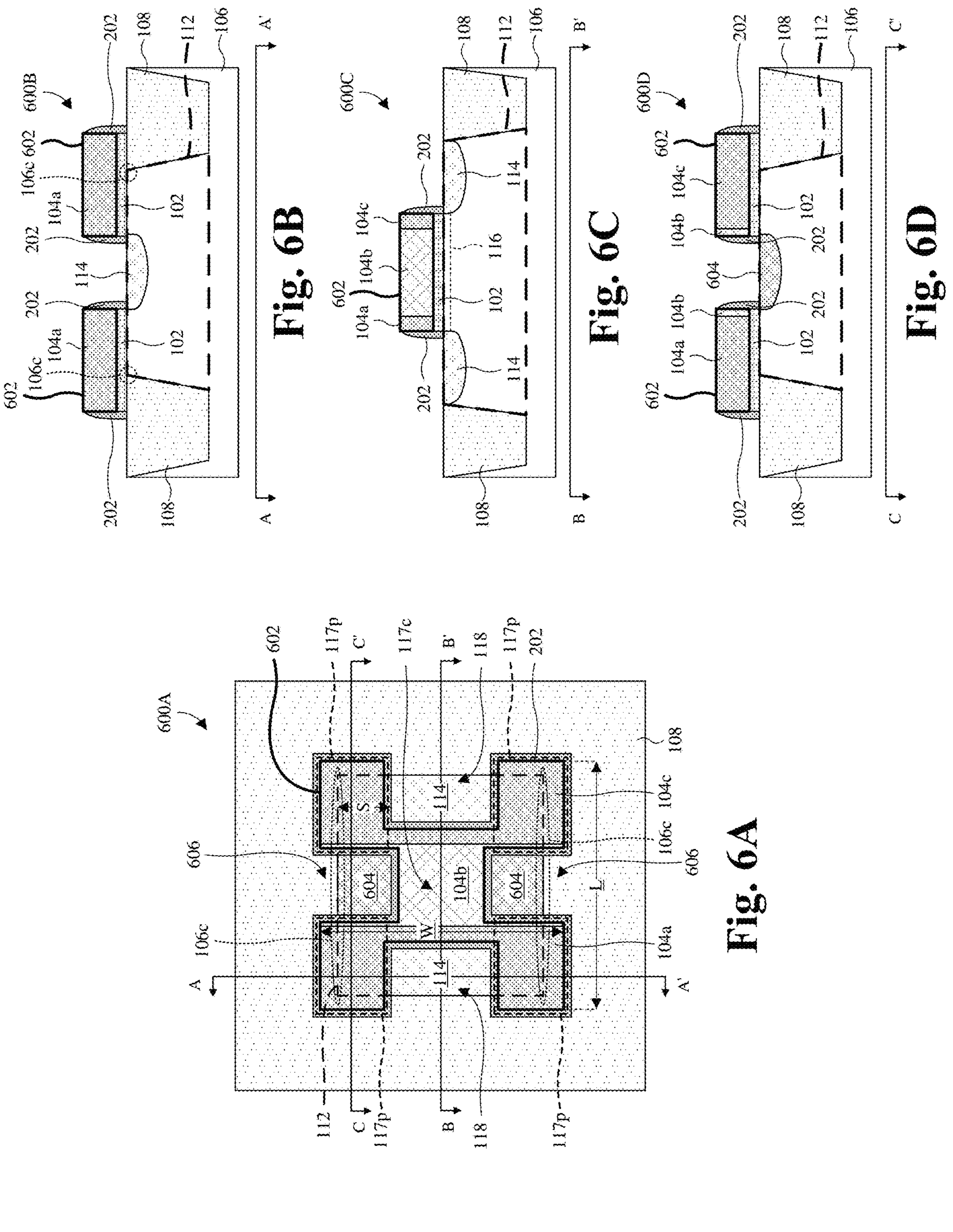
Figure 7B:
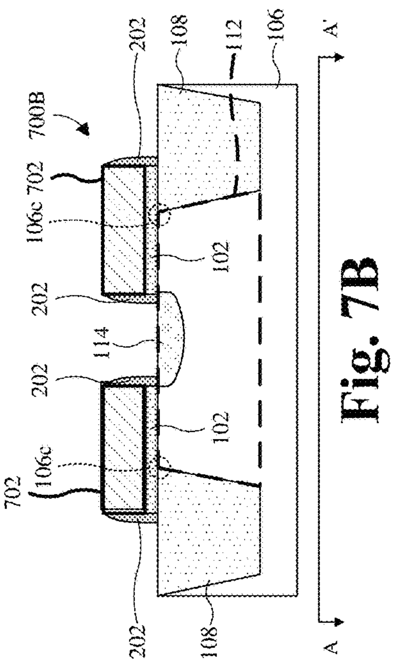
Figure 7C:
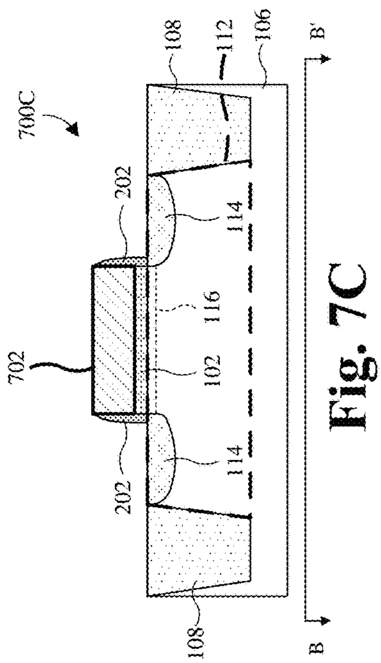
Figure 7D:
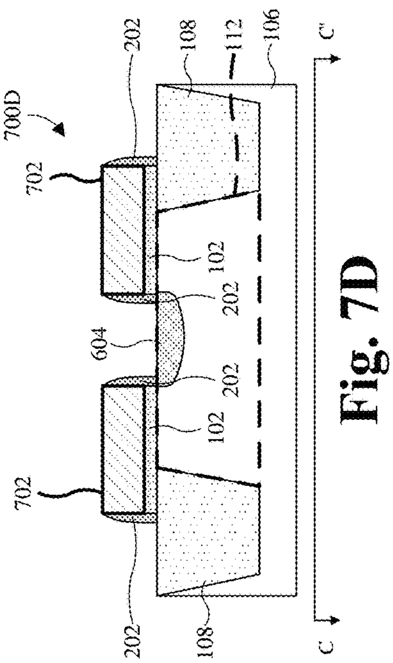
Figure 7A:
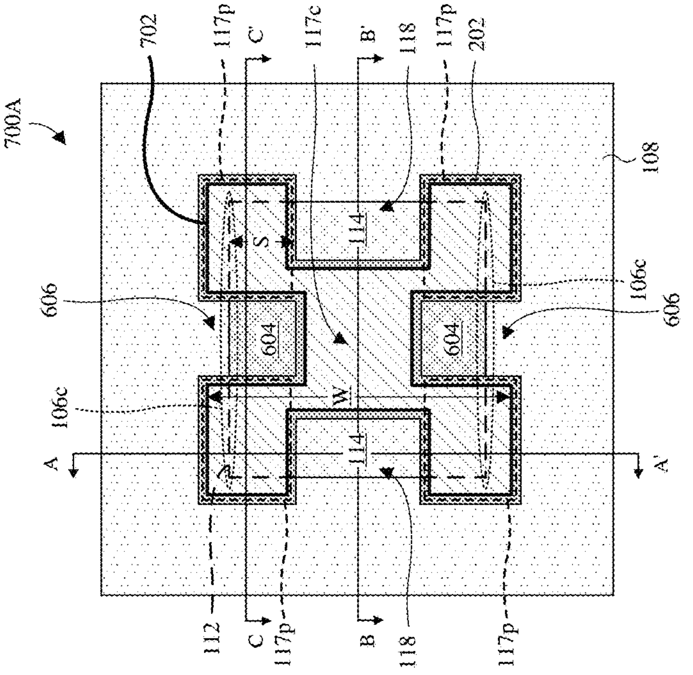
Figure 8A:
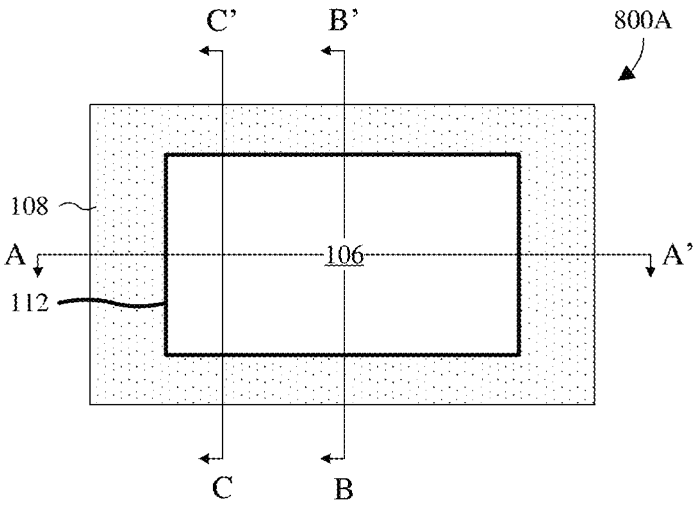
FIGS. 8A-8D through 17A-17D illustrate a series of views of some embodiments of a method for forming a FET with low flicker and random telegraph noise.
Figure 8B:
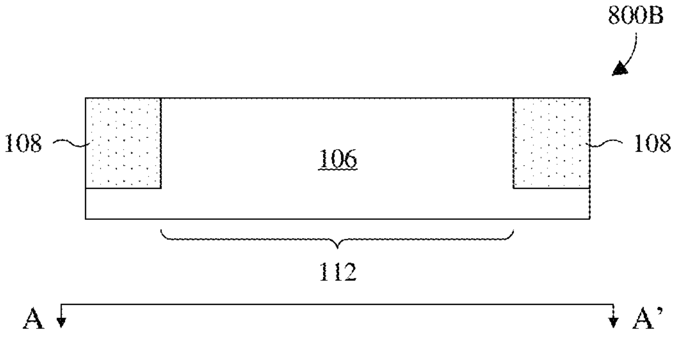
Figure 8C:
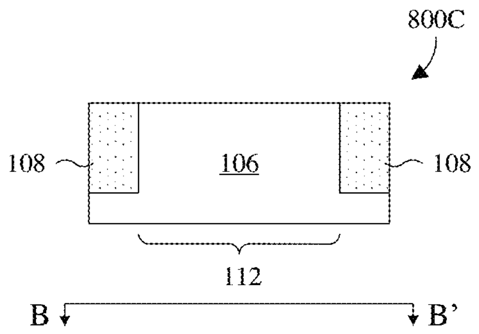
Figure 8D:
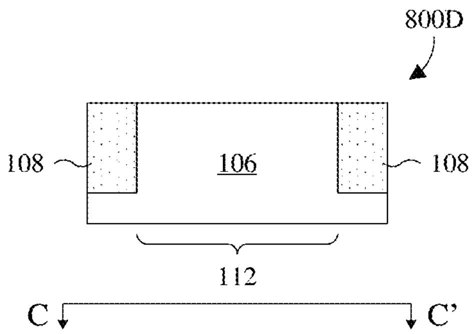

A pair of lateral gate openings 606 is defined by the plate 602 and, in some embodiments, the plate dielectric layer 102 (See FIGS. 6B-6D). The lateral gate openings 606 extend vertically through the plate 602, from top to bottom, and extend laterally into sides of the plate 602. The lateral gate openings 606 are each laterally spaced between the source/drain regions 114. In some embodiments, the lateral gate openings 606 are at a length-wise center of the plate 602 (i.e., at a center of the length L of the plate 602). Further, the lateral gate openings 606 are respectively on opposite sides of the plate 602 and respectively overlie the gate regions 604. In some embodiments, the lateral gate openings 606 are laterally spaced along the width W of the plate 602. Further, in some embodiments, the lateral gate openings 606 each have a side that is open, and three sides defined by the plate 602 and, in some embodiments, the plate dielectric layer 102.

As illustrated by the views 700A-700D of FIGS. 7A-7D, a plate 702 overlaps the isolation corners 106*c* and is laterally between a pair of source/drain regions 114. The source/drain regions 114 are laterally spaced in a first direction, and the gate regions 604 are laterally spaced in a second direction orthogonal or substantially orthogonal to the first direction. Further, each of the gate regions 604 are laterally spaced from the source/drain regions 114 in the first direction. The plate 702 is undoped or comprises a single doping type, such as, for example, n-type or p-type. In some embodiments, the plate 702 comprises doped polysilicon with the same doping type as the gate regions 404.

Figure 9A:
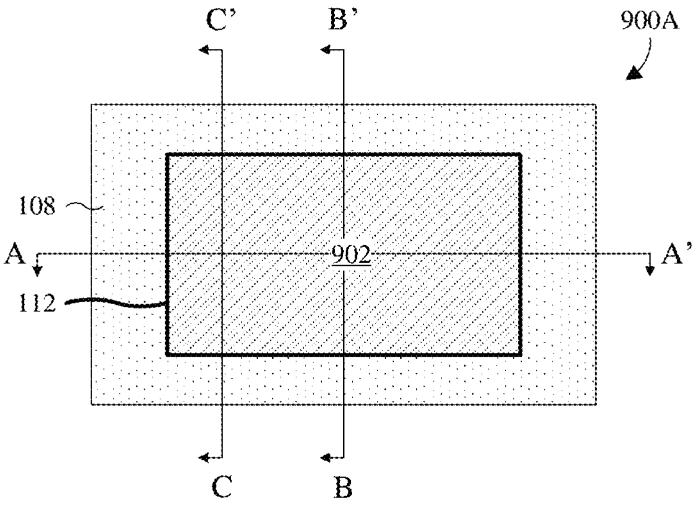
Figure 9B:
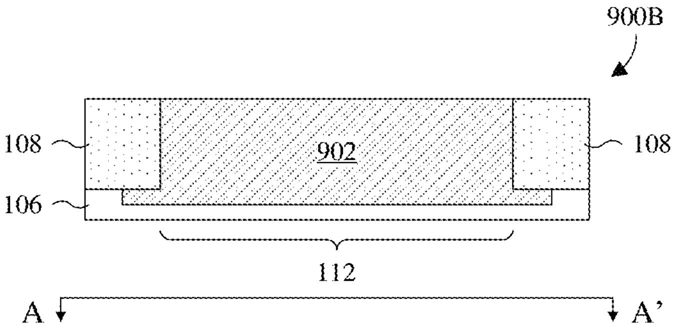
Figure 9C:
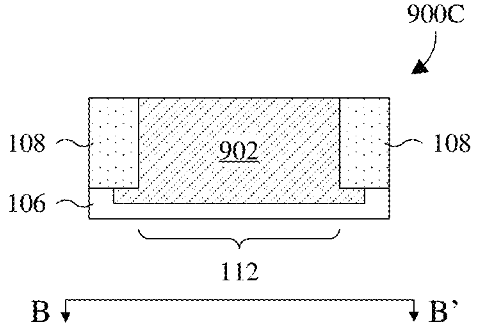
Figure 9D:
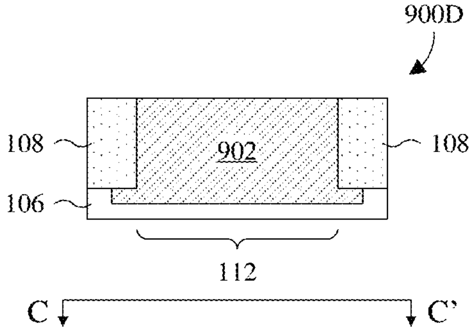
Figure 10A:
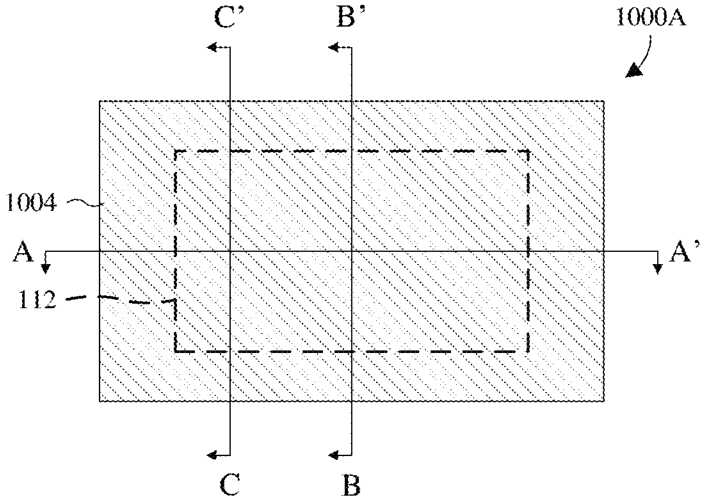
Figure 10B:
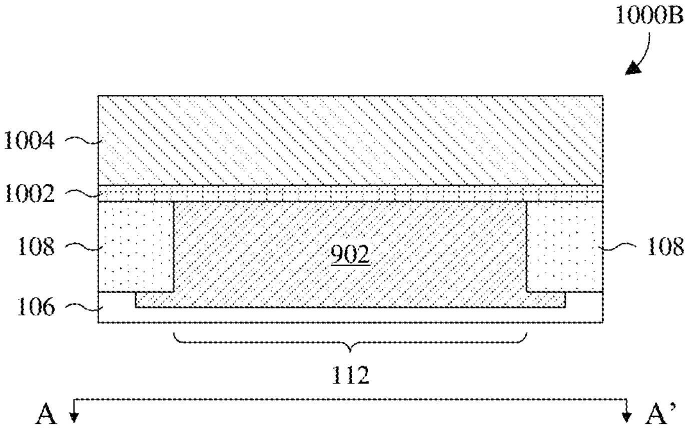
Figure 10C:
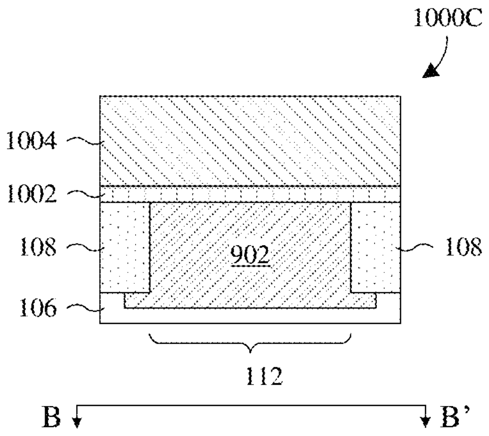
Figure 10D:
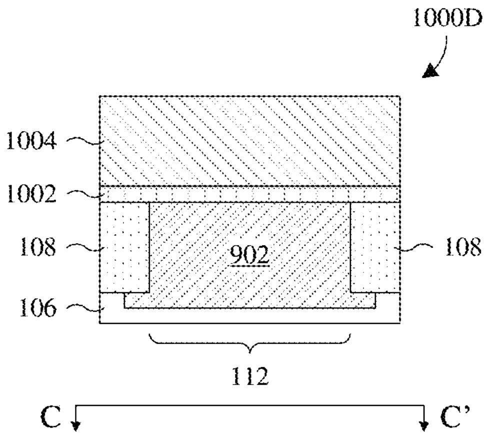
Figure 11A:
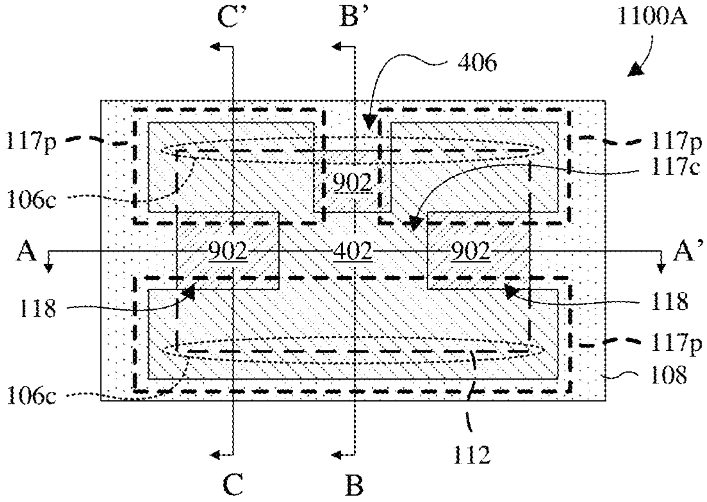
Figure 11B:
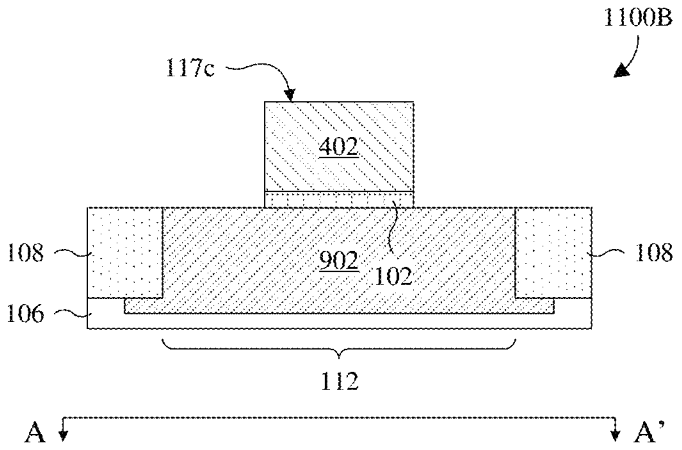
Figure 11C:
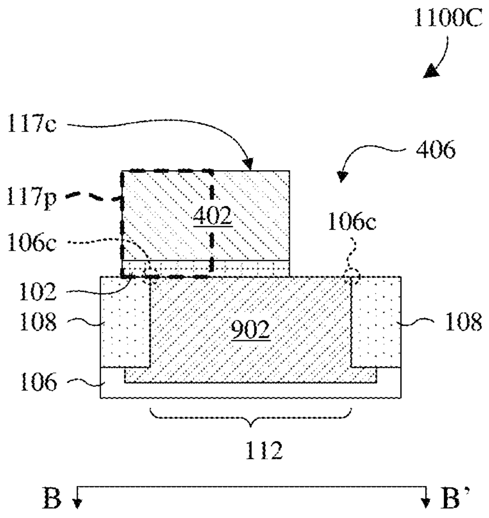
Figure 11D:
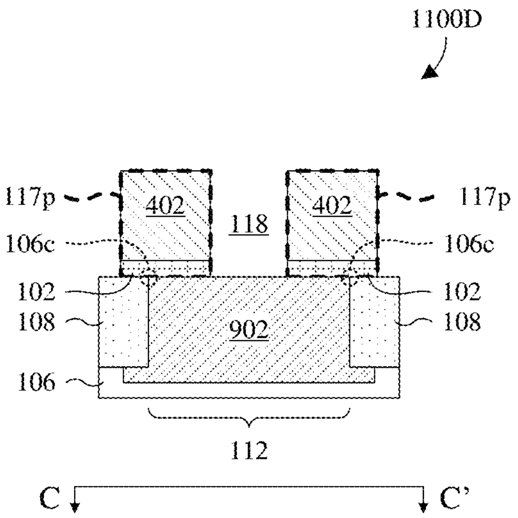
Figure 12A:
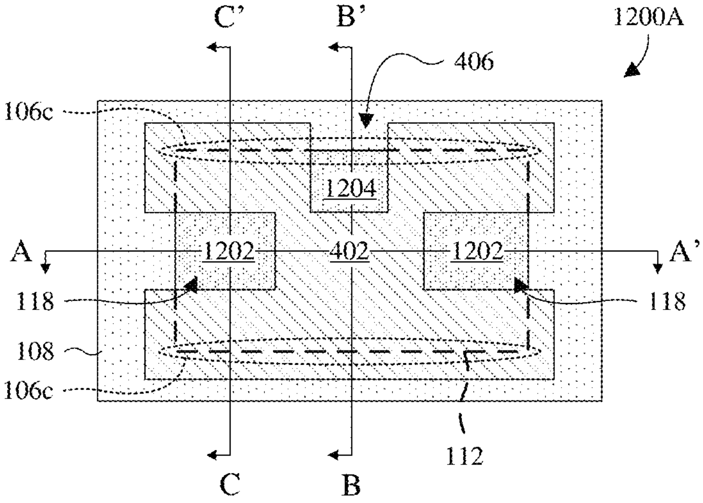
Figure 12B:
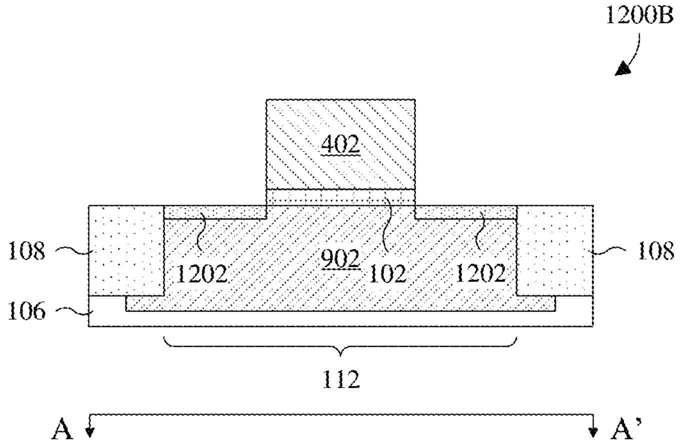
Figure 12C:
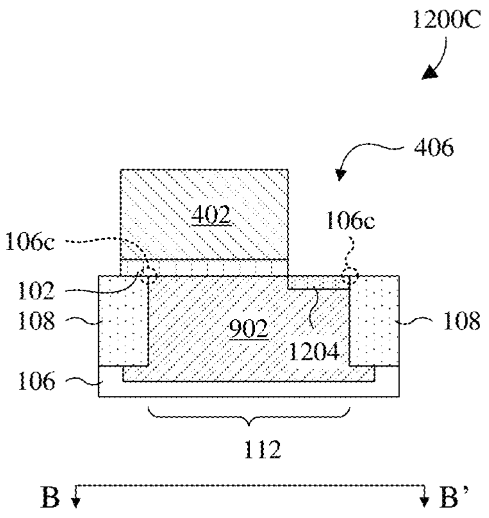
Figure 12D:
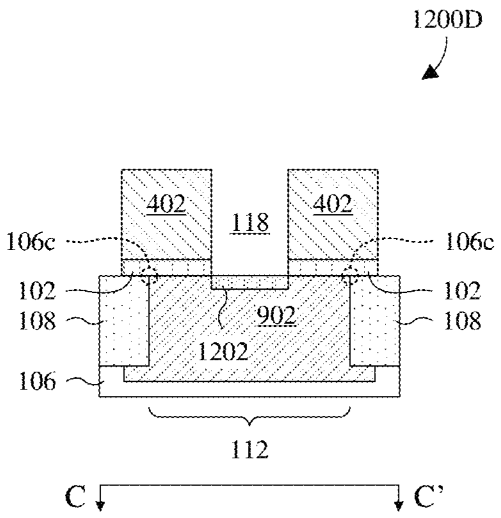
Figure 13A:
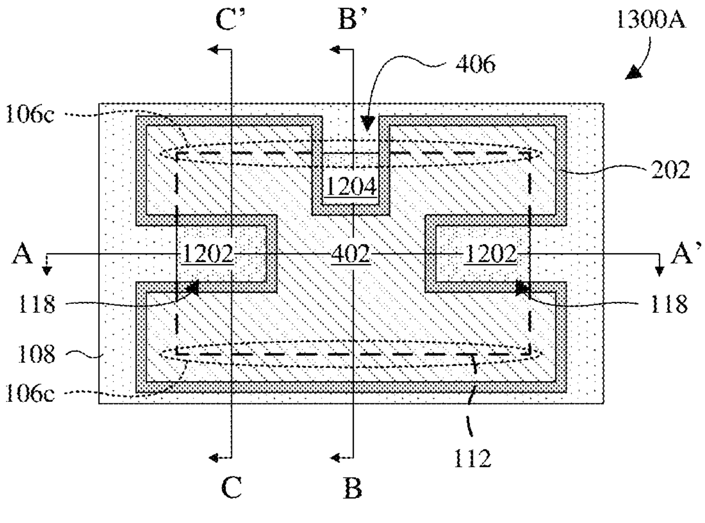
Figure 13B:
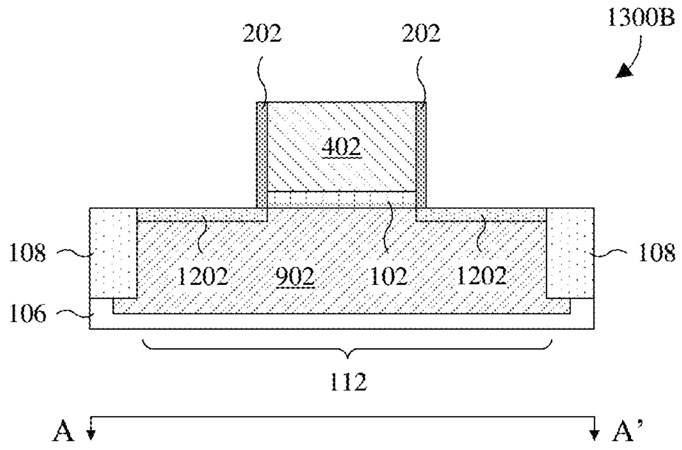
Figure 13C:
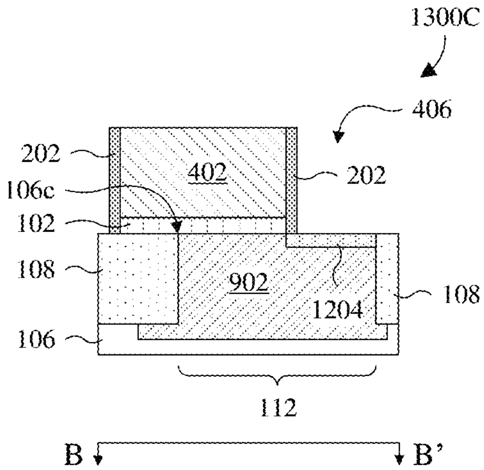
Figure 13D:
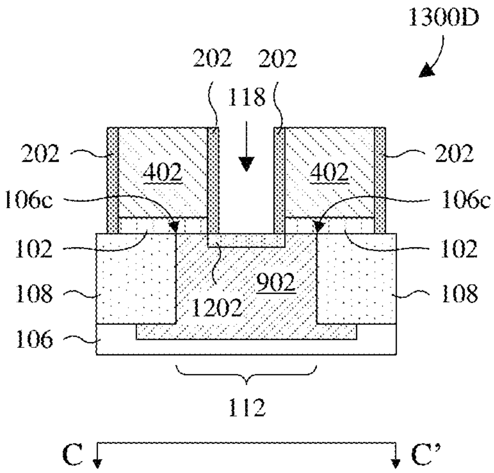
Figure 14A:
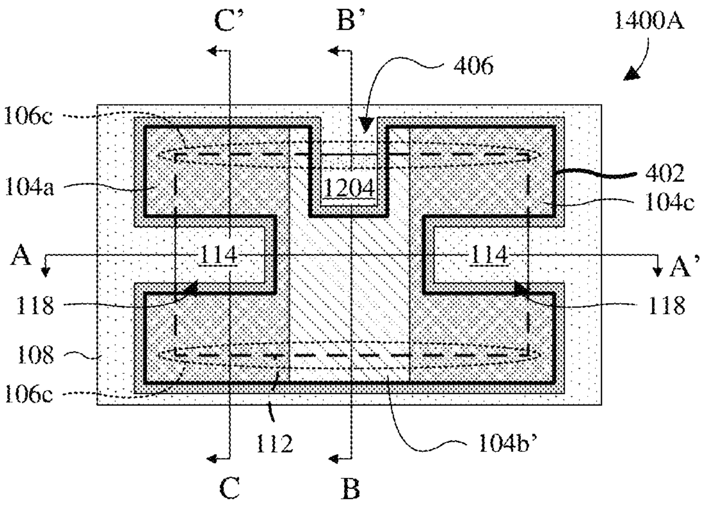
Figure 14B:
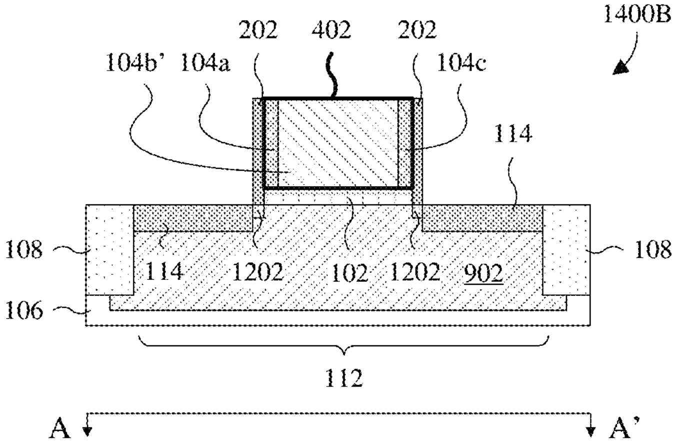
Figure 14C:
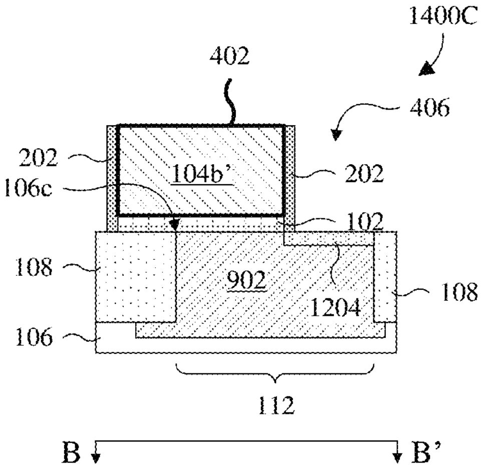
Figure 14D:
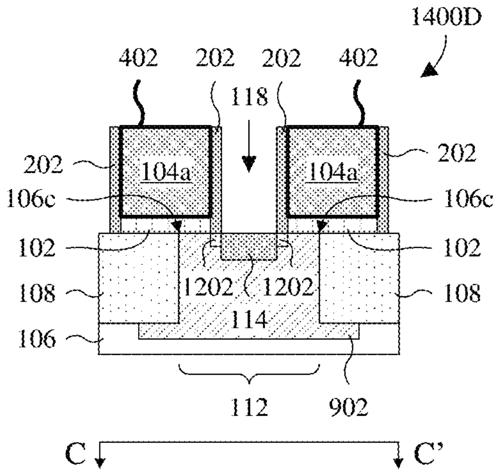
Figure 15A:
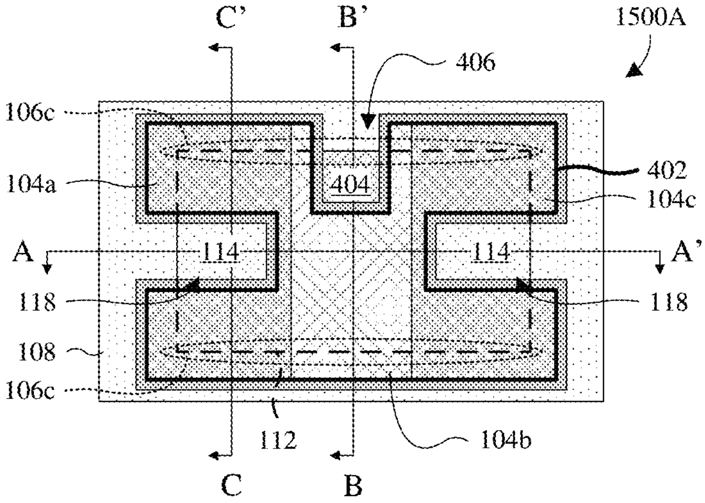
Figure 15B:
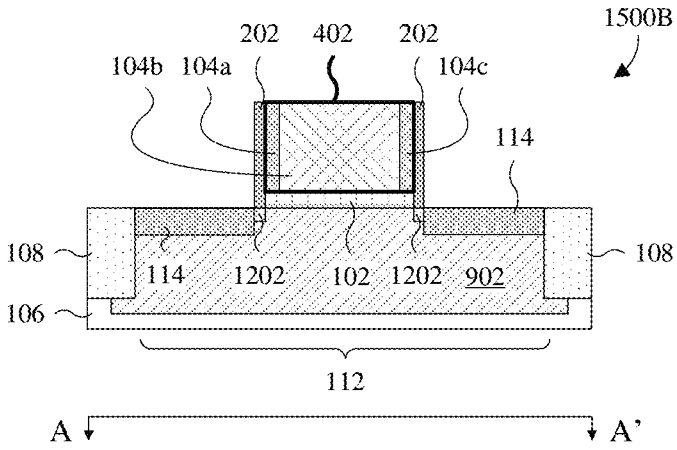
Figure 15C:
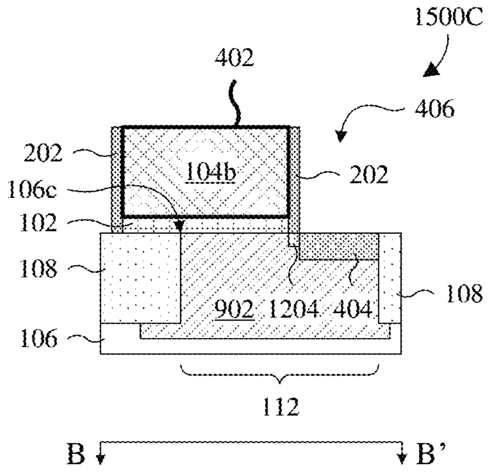
Figure 15D:
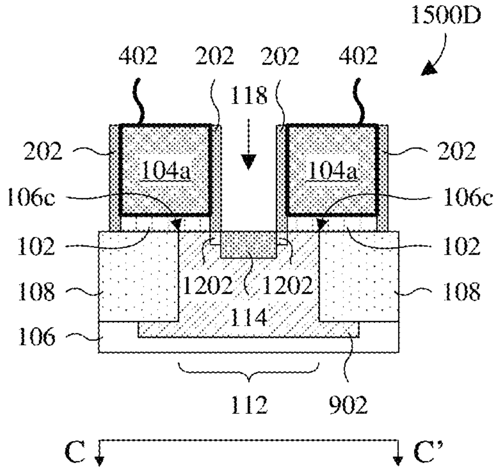
Figure 16A:
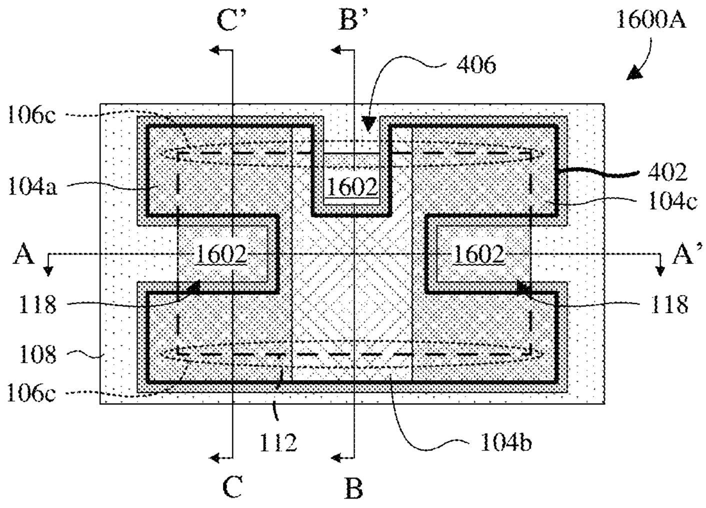
Figure 16B:
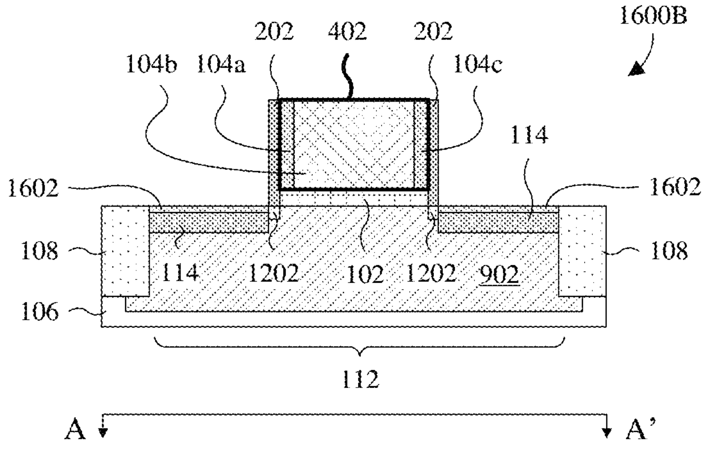
Figure 16C:
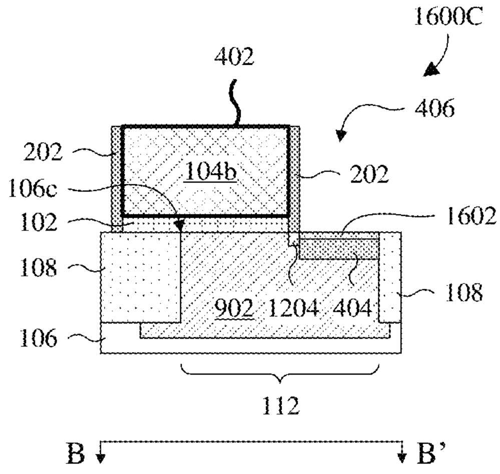
Figure 16D:
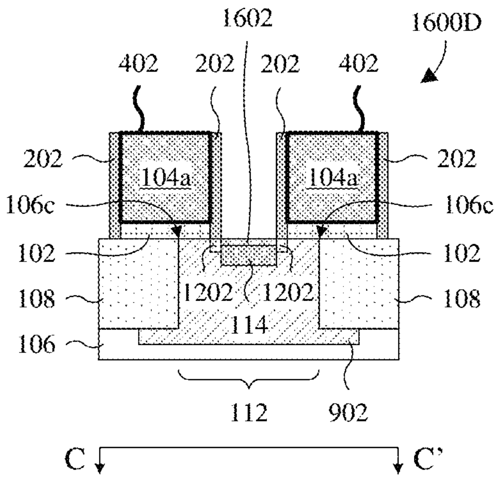
Figure 17A:
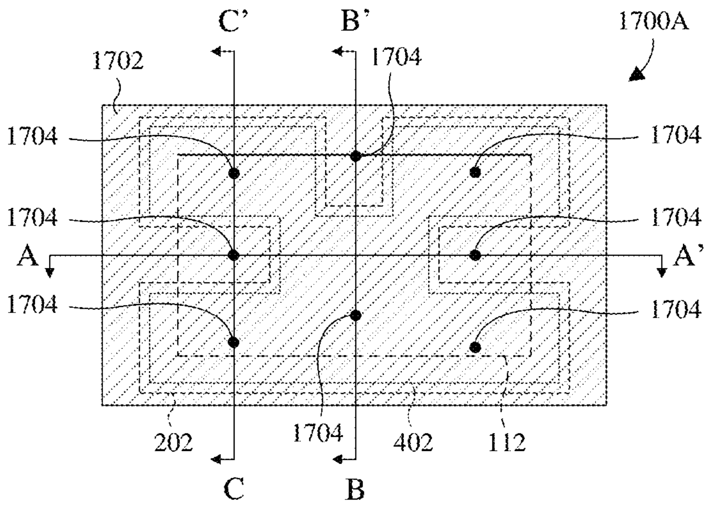
Figure 17B:
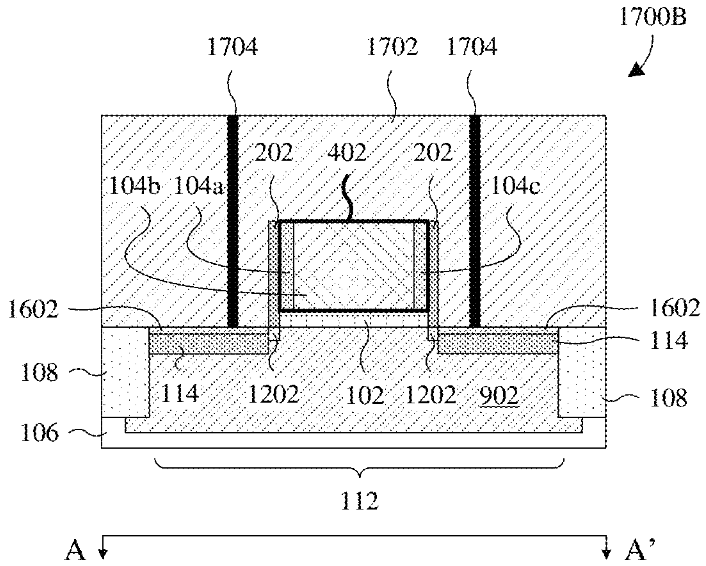
Figure 17C:
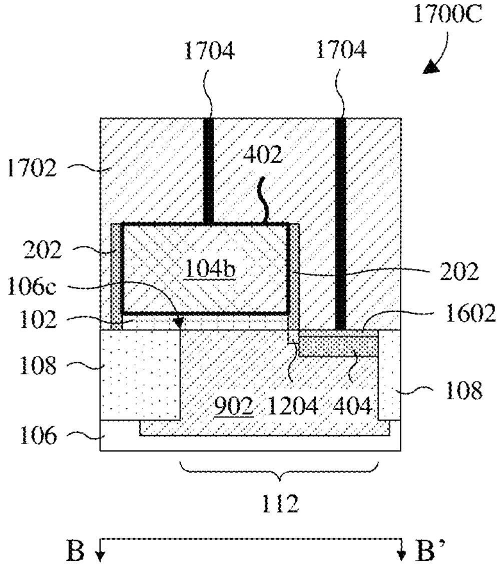
Figure 17D:
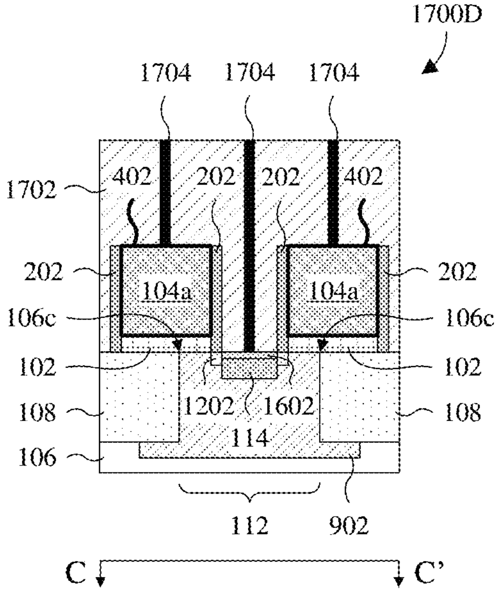

With reference to FIGS. 8A-8D through 17A-17D, a series of views 800A-800D through 1700A-1700D of some embodiments of a method for manufacturing a FET with reduced flicker and random telegraph noise is provided. Figures having a suffix of "A" (e.g., FIG. 8A) are top views of the FET under manufacture. Figures having a suffix of "B" (e.g., FIG. 9B) are cross-sectional views of the FET manufacture, taken along line A-A' in the figures having a suffix of "A". Figures having a suffix of "C" (e.g., FIG. 10C) are cross-sectional views of the FET under manufacture, taken along line B-B' in the figures having a suffix of "A". Figures having a suffix of "D" (e.g., FIG. 11D) are cross-sectional views of the FET under manufacture, taken along line C-C' in the figures having a suffix of "A". The FET may, for example, be the FET of FIGS. 4A-4D.

As illustrated by the views 800A-800D of FIGS. 8A-8D, an isolation structure 108 is formed over the semiconductor substrate 106, sunken into a top of the semiconductor substrate 106. Further, the isolation structure 108 is formed demarcating a device region 112 of the semiconductor substrate 106. In some embodiments, the device region 112 of the semiconductor substrate 106 has a polygonal layout, and/or the isolation structure 108 has a polygonal ring-shaped layout. The isolation structure 108 may be, for example, an STI or DTI region, and/or the semiconductor substrate 106 may be, for example, a bulk substrate of monocrystalline or polycrystalline silicon or some other type of semiconductor substrate.

In some embodiments, a process for forming the isolation structure 108 comprises performing an etch into the semiconductor substrate 106 to form a trench in the semiconductor substrate 106, and subsequently filling the trench with a dielectric material. The trench may, for example, be formed with the desired layout of the isolation structure, and/or the dielectric material may be, for example, silicon dioxide.

As illustrated by the views 900A-900D of FIGS. 9A-9D, in some embodiments, a well 902 is formed in the device region 112 of the semiconductor substrate 106. The well 902 is a region of the semiconductor substrate 106 having an n-type doping or a p-type doping. Further, in some embodiments, the well 902 has a doping type opposite that of adjoining regions of the semiconductor substrate 106, or the adjoining regions of the semiconductor substrate 106 are intrinsic. The well 902 may, for example, be formed by ion implantation.

As illustrated by the views 1000A-1000D of FIGS. 10A-10D, a dielectric layer 1002 and a conductive layer 1004 are formed on the isolation structure 108 and the device region 112 of the semiconductor substrate 106, such that the conductive layer 1004 overlies the dielectric layer 1002. The dielectric layer 1002 may, for example, be silicon dioxide, a high κ dielectric, or some other dielectric, and/or the conductive layer 1004 may be, for example, doped polysilicon, metal, or some other conductive. In other embodiments, the conductive layer 1004 is polysilicon that undergoes a subsequent doping process by, for example, ion implantation.

In some embodiments, a process for forming the dielectric layer 1002 and the conductive layer 1004 comprises depositing or growing the dielectric layer 1002 on the isolation structure 108 and the device region 112 of the semiconductor substrate 106, and subsequently depositing or growing the conductive layer 1004 on the dielectric layer 1002. The dielectric layer 1002 may, for example, be deposited or grown by thermal oxidation, chemical or physical vapor deposition, sputtering, or some other deposition or growth process. The conductive layer 1004 may, for example, be deposited or grown by chemical or physical vapor deposition, sputtering, electrochemical plating, electroless plating, or some other deposition or growth process.

As illustrated by the views 1100A-1100D of FIGS. 11A-11D, the conductive layer 1004 (see FIGS. 10A-10D) and the dielectric layer 1002 (see FIGS. 10A-10D) are patterned respectively into a plate 402 and a plate dielectric layer 102. The plate 402 and the plate dielectric layer 102 are stacked on the isolation structure 108 and the device region 112 of the semiconductor substrate 106, such that plate 402 overlies the plate dielectric layer 102. Further, the plate 402 and the plate dielectric layer 102 overlap a pair of isolation corners 106*c* of the semiconductor substrate 106. The isolation corners 106*c* are top cross-sectional corners of the semiconductor substrate 106 that border the isolation structure 108 in the device region 112 and that adjoin the plate dielectric layer 102. Further, the isolation corners 106*c* are line shaped and extend laterally in parallel in a first direction from a first end of the device region 112 to a second end of the device region 112 opposite the first end. The plate 402 and the plate dielectric layer 102 define a pair of lateral plate openings 118 respectively on the first and second ends of the device region 112. Further, the lateral plate openings 118 are each laterally spaced between the isolation corners 106*c* in the second direction. Further, in some embodiments, the plate 402 and the plate dielectric layer 102 define a lateral gate opening 406 that is laterally spaced between the lateral plate openings 118 in the first direction and that borders one of the isolation corners 106*c*. In further embodiments, the lateral gate opening 406 is paired with another lateral gate opening on an opposite side of the plate 104. See, for example, FIGS. 6A-6D.

In some embodiments, the plate 402 and the plate dielectric layer 102 have a polygonal-shaped layout comprising sixteen sides. In other embodiments, the polygonal shaped-layout has more (or less) than sixteen sides. Further, in some embodiments, the plate 402 and the plate dielectric layer 102 have a plurality of peripheral plate portions 117*p* and a central plate portion 117*c*. The peripheral plate portions 117*p* protrude from the central plate portion 117*c*. In some embodiments, a first one the peripheral plate portions 117*p* extends laterally in the first direction, from the first end of the device region 112 to the second end of the device region 112. A second one of the peripheral plate portions 117*p* extends laterally in the first direction, from the first end of the device region 112 to a first side of the lateral gate opening 406. A third one of the peripheral plate portions 117*p* extends laterally in the first direction, from a second side of the lateral gate opening 406 opposite the first side to the second end of the device region 112. Further, the peripheral plate portions 117*p* respectively cover the isolation corners 106*c*. The central plate portion 117*c* is between the peripheral plate portions 117*p*, and interconnects the peripheral plate portions 117*p*.

In some embodiments, a process for patterning the conductive layer 1004 and the dielectric layer 1002 into the plate 402 and the plate dielectric layer 102 comprises forming a patterned photoresist layer (not shown) on the conductive layer 1004. The patterned photoresist layer may, for example, be formed by a spin on process. The patterned photoresist layer may, for example, be patterned with a layout of the plate 402 and may, for example, be patterned using photolithography. Further, in some embodiments, the process comprises performing an etch into the conductive layer 1004 and the dielectric layer 1002 with the patterned photoresist layer in place, and subsequently stripping the patterned photoresist layer.

As illustrated by the views 1200A-1200D of FIGS. 12A-12D, in some embodiments, a pair of lightly-doped source/drain extensions 1202 is formed in the device region 112 of the semiconductor substrate 106. The lightly-doped source/drain extensions 1202 are respectively on opposite sides of the device region 112 of the semiconductor substrate 106, and respectively underlie the lateral plate openings 118 in the plate dielectric layer 102 and the plate 402. Further, the lightly-doped source/drain extensions 1202 are laterally spaced from one another in a first direction, and are laterally spaced from the isolation corners 106*c* in a second direction transverse (e.g., perpendicular or substantially perpendicular) to the first direction. In some embodiments (e.g., where the FET is a MOSFET), the lightly-doped source/drain extensions 1202 may, for example, be doped regions of the semiconductor substrate 106 with an opposite doping type as the well 902. In other embodiments (e.g., where the FET is a JFET), the lightly-doped source/drain extensions 1202 may, for example, be doped regions of the semiconductor substrate 106 with the same doping type as the well 902, but a different doping concentration as the well 902. In yet other embodiments, the lightly-doped source/drain extension 1202 are not formed. In some embodiments, the lightly-doped source/drain extensions 1202 may, for example, be formed by ion implantation, and/or may, for example, be formed using the plate 402 as a mask.

In some embodiments, a lightly-doped gate extension 1204 is also formed in the device region 112 of the semiconductor substrate 106. The lightly-doped gate extension 1204 underlies the lateral gate opening 406 in the plate dielectric layer 102 and the plate 402, and further has a single sidewall adjoining the isolation structure 108 at one of the isolation corners 106*c*. In some embodiments, the lightly-doped gate extension 1204 is paired with another lightly-doped gate extension 1204 on an opposite side of the plate 104 and underlying another lateral gate opening 606. See, for example, FIGS. 6A-6D. The lightly-doped gate extension 1204 may, for example, be a doped region of the semiconductor substrate 106 with a different doping type as the well 902. In some embodiments, the lightly-doped gate extension 1204 is formed by ion implantation, and/or formed using the plate 402 as a mask. In some embodiments, when forming both the lightly-doped source/drain extensions 1202 and the lightly-doped gate extension 1204, a photoresist mask is employed to cover the lightly-doped source/drain extensions 1202 while forming the lightly-doped gate extension 1204 by ion implantation process, or vice versa.

As illustrated by the views 1300A-1300D of FIGS. 13A-13D, a spacer 202 is formed on sidewalls of the plate 402 and the plate dielectric layer 102. Further, in some embodiments, the spacer 202 is formed completely enclosing the plate 402 and the plate dielectric layer 102. The spacer 202 may, for example, be silicon nitride, silicon dioxide, some other dielectric, or a combination of the foregoing.

In some embodiments, a process for forming the spacer 202 comprises depositing or growing a spacer layer covering and conformally lining the structure in FIGS. 12A-12D. The spacer layer may, for example, be deposited or grown by chemical or physical vapor deposition, sputtering, or some other deposition or growth process. Further, in some embodiments, the process comprises performing an etch back into the spacer layer to remove horizontal segments of the spacer layer without removing vertical segments of the spacer layer. A remaining vertical segment corresponds to the spacer 202.

As illustrated by the views 1400A-1400D of FIGS. 14A-14D, a pair of source/drain regions 114 is formed in the device region 112 of the semiconductor substrate 106, and a first doped region 104*a* and a third doped region 104*c* are formed in the plate 402. The source/drain regions 114 are formed laterally spaced from one another in a first direction, and laterally spaced from the isolation corners 106*c* in a second direction transverse (e.g., perpendicular or substantially perpendicular) to the first direction. As noted above, the FET has reduced flicker and random telegraph noise due to the spacing between the isolation corners 106*c* and the source/drain regions 114. Further, the source/drain regions 114 are respectively on opposite sides of the device region 112 of the semiconductor substrate 106, and respectively underlie the lateral plate openings 118 in the plate dielectric layer 102 and the plate 402. The source/drain regions 114 respectively adjoin the lightly-doped source/drain extensions 1202. In some embodiments (e.g., where the FET is a JFET), the source/drain regions 114 may, for example, be regions of the semiconductor substrate 106 with the same doping type as the well 902. In other embodiments (e.g., where the FET is a MOFSET), the source/drain regions 114 may, for example, be regions of the semiconductor substrate 106 with an opposite doping type as the well 902. Further, the source/drain regions 114 may, for example, have the same doping type (e.g., p-type or n-type) as the lightly-doped source/drain extensions 1202 and/or a higher doping concentration than the lightly-doped source/drain extensions 1202.

The first doped region 104*a* and the third doped region 104*c* are formed laterally spaced from one another in a first direction by the second region 104*b*'. The first doped region 104*a* of the plate 402 wraps around one of the source/drain regions 114, and the third doped region 104*c* of the plate 402 wraps around another one of the source/drain regions 114. Further, in some embodiments, the first doped region 104*a* and the third doped region 104*c* are each laterally spaced from the lateral gate opening 406 in the first direction. In some embodiments, the first doped region 104*a* and the third doped region 104*c* may, for example, be regions of the plate 402 with the same doping type as the source/drain regions 114.

In some embodiments, a process for forming the source/drain regions 114, the first doped region 104*a*, and the third doped region 104*c* comprises forming a patterned photoresist layer (not shown) on the structure in FIGS. 13A-13D and subsequently performing an ion implantation process. The patterned photoresist layer may, for example, be formed by a spin on process. The patterned photoresist layer may, for example, be patterned with a layout covering structure surrounding the device region 112, and further covering the exposed lightly-doped gate extension 1204 and the second region 104*b*'. Further, in some embodiments, the process comprises performing an ion implantation into the plate 402 and the semiconductor substrate 106 with the patterned photoresist layer in place, and subsequently stripping the patterned photoresist.

As illustrated by the views 1500A-1500D of FIGS. 15A-15D, a gate region 404 is formed in the device region 112 of the semiconductor substrate 106, and a second doped region 104*b* is formed in the plate 104. The gate region 404 is formed laterally between and spaced from the source/drain regions 114. Further, the gate region 404 adjoins a single sidewall of the isolation structure 108 at one of the isolation corners 106*c*, and underlies the lateral gate opening 406 in the plate dielectric layer 102 and the plate 402. In some embodiments, the gate region 404 is paired with another gate region on an opposite side of the plate 104. See, for example, FIGS. 6A-6D. In some embodiments, the gate region 404 adjoins the lightly-doped gate extensions 1204. The gate region 404 may, for example, be a region of the semiconductor substrate 106 with an opposite doping type as the source/drain regions 114 and/or the well 902. Further, the gate region 404 may, for example, have the same doping type (e.g., p-type or n-type) as the lightly-doped gate extension 1204 and/or a higher doping concentration than the lightly-doped gate extension 1204.

The second doped region 104*b* is formed in the plate 402 between the first doped region 104*a* and the third doped region 104*c*, such that the second doped region 104*b* is laterally spaced from the source/drain regions 114 by the first doped region 104*a* and the third doped region 104*c*. Further, in some embodiments, the second doped region 104*b* wraps around the lateral gate opening 406. In some embodiments, the second doped region 104*b* is a region of the plate 402 with the same doping type as the gate region 404. As noted above, the FET has reduced flicker and random telegraph noise due to the arrangement and doping types of the first, second, and third doped regions 104*a*,

104*b*, 104*c* altering the work function of the plate 104 to drive current flow deeper into the selectively-conductive channel 116.

In some embodiments, a process for forming the gate region 404 and the second doped region 104*b* comprises forming a patterned photoresist layer (not shown) on the structure in FIGS. 14A-14D and subsequently performing an ion implantation process. The patterned photoresist layer may, for example, be formed by a spin on process. The patterned photoresist layer may, for example, be patterned with a layout covering the first doped region 104*a*, the third doped region 104*c*, and the source/drain regions 114, such that a top surface of the plate 402 is partially exposed between the first doped region 104*a* and the third doped region 104*c*. Further, in some embodiments, the process comprises performing an ion implantation into the plate 402 and the semiconductor substrate 106 with the patterned photoresist layer in place, and subsequently stripping the patterned photo resist.

As illustrated by the views 1600A-1600D of FIGS. 16A-16D, in some embodiments, silicide layers 1602 are formed on the source/drain regions 114 and the gate region 404. Further, in some embodiments, an additional silicide layer (not shown) is formed on the first doped region 104*a*, the second doped region 104*b*, and/or the third doped region 104*c*. The silicide layers 1602 may, for example, be nickel silicide, titanium silicide, cobalt silicide, platinum silicide, tungsten silicide, or some other transition metal silicide.

In some embodiments, a process for forming the silicide layers 1602 comprises depositing a transition metal layer covering the structure of FIGS. 15A-15D, and subsequently heating the transition metal layer so it reacts with exposed silicon to form the silicide layers 1602. Further, in some embodiments, the process comprising removing unreacted material of the transition metal layer by an etch. The process may, for example, be a self-aligned process.

As illustrated by the views 1700A-1700D of FIGS. 17A-17D, an ILD layer 1702 is formed covering the structure of FIGS. 16A-16D. The ILD layer 1702 may, for example, be formed with a planar top surface, and/or may, for example, be formed of oxide, nitride, a low κ dielectric, some other dielectric, or a combination of the foregoing.

In some embodiments, a process for forming the ILD layer 1702 comprises depositing or growing the ILD layer 1702 covering the structure of FIGS. 16A-16D, and subsequently performing a planarization into the ILD layer 1702. The depositing or growing may, for example, be formed by chemical or physical vapor deposition, sputtering, some other deposition or growth process, or a combination of the foregoing. The planarization may, for example, be performed by chemical mechanical polishing (CMP).

Also illustrated by the views 1700A-1700D of FIGS. 17A-17D, contact vias 1704 are formed extending through the ILD layer 1702 to the source/drain regions 114 and/or the silicide layers 1602. The silicide layers 1602 facilitate ohmic contacts between the contact vias 1704 and the source/drain regions 114. Further, the contact vias 1704 are formed extending through the ILD layer 1702 to the first, second, and/or third doped region 104*a*, 104*b*, 104*c* and/or an additional silicide layer (not shown) on the first, second, and/or third doped region 104*a*, 104*b*, 104*c*.

In some embodiments, a process for forming the contact vias 1704 comprises performing an etch into the ILD layer 1702 to form contact-via openings corresponding to the contact vias 1704. The etch may be, for example, performed using photolithography. Further, in some embodiments, the process comprises filling the contact-via openings with a conductive material. The contact-via openings may, for example, be filled by depositing or growing a conductive layer covering the ILD layer 1702 and filling the contact-via openings, and subsequently performing a planarization into the ILD layer and the conductive layer. The planarization may, for example, be performed by CMP. The process may, for example, be part of a single damascene like process or a dual damascene like process.

While not shown, additional dielectric layers and conductive features may be subsequently formed on the ILD layer 1702. For example, one or more additional ILD layers, wires, inter-wire vias, and/or passivation layers may be formed on the ILD layer 1702.

Further, although FIGS. 8A-8D through 17A-17D illustrate a process for forming the embodiment depicted in FIG. 4A-4D, it is appreciated that a person of ordinary skill could implement the steps above (or substantially similar steps) to form the embodiments depicted in FIGS. 2A-2C, FIGS. 3A-3D, and FIGS. 5A-5D through 7A-7D.

Figure 18:
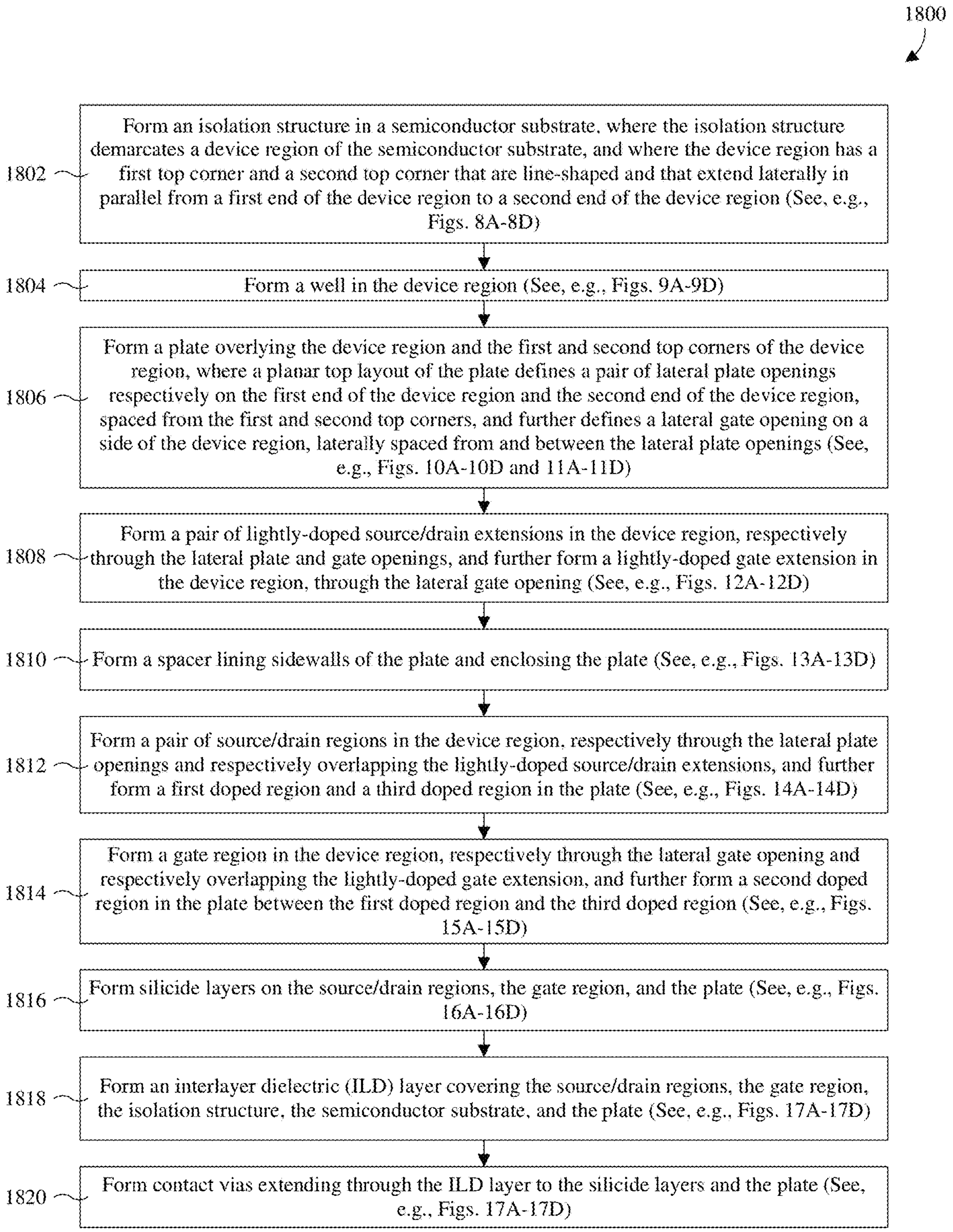
FIG. 18 illustrates a flowchart of some embodiments of the method of FIGS. 8A-8D through 17A-17D.

With reference to FIG. 18, a flowchart 1800 of some embodiments of the method for forming a FET with reduced flicker and random telegraph noise is provided. While the disclosed method and other methods illustrated and/or described herein may be illustrated and/or described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1802, an isolation structure is formed in a semiconductor substrate. The isolation structure demarcates a device region of the semiconductor substrate. The device region has a first top corner and a second top corner that are line-shaped and that extend laterally in parallel from a first end of the device region to a second end of the device region. See, for example, FIGS. 8A-8D.

At 1804, in some embodiments, a well is formed in the device region. See, for example, FIGS. 9A-9D.

At 1806, a plate is formed overlying the device region and the first and second top corners of the device region, where a planar top layout of the plate defines a pair of lateral plate openings respectively on the first end of the device region and the second end of the device region, spaced from the first and second top corners, and further defines a lateral gate opening on a side of the device region, laterally spaced from and between the lateral plate openings. See, for example, FIGS. 10A-10D and 11A-11D.

At 1808, in some embodiments, a pair of lightly-doped source/drain extensions is formed in the device region, respectively through the lateral plate openings. Further, in some embodiments, a lightly-doped gate extension is formed in the device region, through the lateral gate opening. See, for example, FIGS. 12A-12D.

At 1810, a spacer is formed lining sidewalls of the plate and enclosing the plate. See, for example, FIGS. 13A-13D.

At 1812, a pair of source/drain regions is formed in the device region, respectively through the lateral plate openings and respectively overlapping the lightly-doped source/drain extensions. Further, a first doped region and a third doped region are formed in the plate. See, for example, FIGS. 14A-14D.

At 1814, a gate region is formed in the device region, respectively through the lateral gate opening and respectively overlapping the lightly-doped gate extension. Further, a second doped region is formed in the plate between the first doped region and the third doped region. See, for example, FIGS. 15A-15D.

At 1816, in some embodiments, silicide layers are formed on the source/drain regions, the gate region, and the plate. See, for example, FIGS. 16A-16D.

At 1818, an ILD layer is formed covering the source/drain regions, the gate region, the isolation structure, the semiconductor substrate, and the plate. See, for example, FIGS. 17A-17D.

At 1820, contact vias are formed extending through the ILD layer to the silicide layers and the plate. See, for example, FIGS. 17A-17D.

By spacing lateral plate openings from the first and second top corners, the source/drain regions and the lightly-doped source/drain extensions are also spaced from the first and second top corners. This, in turn, decreases source-drain current flowing along the first and second top corners, thereby reducing flicker and random telegraph noise. Further, by doping the plate, the work function of the plate can be manipulated to push source-drain current deep into the device region and away from a top surface of the device region. This may further reduce flicker and random telegraph noise by reducing current flow at the top surface, where there is a high concentration of defect states.

Thus, as can be appreciated from above, the present application relates to a plate design (and related method) to decrease flicker and random telegraph noise in semiconductor devices that is attributed to defects along STI corners and defects along the interface between the device region and the plate dielectric layer.

Accordingly, in some embodiments, the present application provides a semiconductor device. The semiconductor device includes a semiconductor substrate having a device region. An isolation structure extends laterally in a closed path to demarcate the device region. A first source/drain region and a second source/drain region are in the device region and laterally spaced. A sidewall of the first source/drain region directly contacts the isolation structure at a first isolation structure sidewall. The remaining sidewalls of the first source/drain region are spaced from the isolation structure. A selectively-conductive channel is in the device region and extends laterally from the first source/drain region to the second source/drain region. The semiconductor device further includes a plate having a central portion and a first peripheral portion. The central portion overlies the selectively-conductive channel, and the first peripheral portion protrudes from the central portion towards the first isolation structure sidewall.

In other embodiments, the present application provides a semiconductor device having a semiconductor substrate. A pair of source/drain regions is in the semiconductor substrate. The source/drain regions share a first doping type and are laterally spaced. A selectively-conductive channel is in the semiconductor substrate. The selectively-conductive channel extends laterally from one of the source/drain regions to another one of the source/drain regions. The semiconductor device further includes a polysilicon plate having a first doped region, a second doped region, and a third doped region. The second doped region overlies the selectively-conductive channel and is between the first doped region and the third doped region. The first and third doped regions respectively wrap around the source/drain regions and have the first doping type. The second doped region has a second doping type that is opposite the first doping type.

In yet other embodiments, the present application provides a method for manufacturing a semiconductor device. An isolation structure is formed in a semiconductor substrate. The isolation structure demarcates a device region of the semiconductor substrate. A plate is formed overlying the device region of the semiconductor substrate. The plate wraps around a first portion of the device region and a second portion of the device region. The first and second portions of the device region are on opposite sides of the device region and are separated by the plate. Further, the first and second portions of the device region each have a single sidewall adjoining the isolation structure. A first doping process is performed to implant first dopants into the device region of the semiconductor substrate. The first doping process is performed with the plate in place and forms a pair of source/drain regions, where the source/drain regions are respectively in the first portion of the device region and the second portion of the device region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a device region disposed in a semiconductor substrate;

a first source/drain region disposed in the device region and having a first doping type;

a second source/drain region disposed in the device region and having the first doping type, wherein the first source/drain region is spaced from the second source/drain region, and wherein a first portion of the device region extends laterally from the first source/drain region to the second source/drain region;

a gate region disposed in the device region, wherein the gate region adjoins a side of the first portion of the device region laterally between the first source/drain region and the second source/drain region; and a plate disposed over the semiconductor substrate, wherein:

the plate comprises a first doped region, a second doped region, and a third doped region;

the first doped region and the third doped region have the first doping type;

the second doped region has a second doping type opposite the first doping type;

the second doped region is disposed between the first doped region and the third doped region; and the second doped region overlies a first section of the first portion of the device region.

2. The semiconductor device of claim 1, wherein:

the first doped region overlies a second section of the first portion of the device region; and the second section of the first portion of the device region is disposed laterally between the first section of the first portion of the device region and the first source/drain region.

3. The semiconductor device of claim 2, wherein:

the third doped region overlies a third section of the first portion of the device region; and the third section of the first portion of the device region is disposed laterally between the first section of the first portion of the device region and the second source/drain region.

4. The semiconductor device of claim 1, wherein a planar top layout of the plate is H-shaped.

5. The semiconductor device of claim 4, wherein:

a planar top layout of the first doped region is U-shaped; and a planar top layout of the third doped region is U-shaped.

6. The semiconductor device of claim 5, wherein the U-shaped planar top layout of the first doped region is a reflection of the U-shaped planar top layout of the third doped region across an axis.

7. The semiconductor device of claim 1, further comprising:

a plate dielectric layer disposed over the semiconductor substrate and separating the plate from the semiconductor substrate, wherein the plate comprises a semiconductor material.

8. A semiconductor device comprising:

an isolation structure disposed in a semiconductor substrate, wherein the isolation structure demarcates a device region in the semiconductor substrate;

a first source/drain region disposed in the device region and having a first doping type;

a second source/drain region disposed in the device region and having the first doping type, wherein the first source/drain region is spaced from the second source/drain region, and wherein a first portion of the device region extends laterally from the first source/drain region to the second source/drain region;

a gate region disposed in the device region, wherein the gate region adjoins a side of the first portion of the device region laterally between the first source/drain region and the second source/drain region; and a plate disposed over the semiconductor substrate, wherein:

the plate comprises a first doped region, a second doped region, and a third doped region;

the first doped region and the third doped region have the first doping type;

the second doped region has a second doping type opposite the first doping type;

the second doped region is disposed between the first doped region and the third doped region; and the second doped region overlies a first section of the first portion of the device region.

9. The semiconductor device of claim 8, wherein:

a first side of the second doped region is opposite a second side of the second doped region;

the first side of the second doped region is laterally disposed between the first source/drain region and the second side of the second doped region;

the second side of the second doped region is laterally disposed between the second source/drain region and the first side of the second doped region; and the gate region is disposed between the first side of the second doped region and the second side of the second doped region.

10. A semiconductor device comprising:

an isolation structure disposed in a semiconductor substrate, wherein the isolation structure demarcates a device region in the semiconductor substrate;

a first source/drain region disposed in the device region, wherein the isolation structure has a first sidewall disposed on a first side of the first source/drain region;

a second source/drain region disposed in the device region and laterally spaced from the first source/drain region, wherein the first source/drain region is disposed laterally between the first sidewall of the isolation structure and the second source/drain region, and wherein a first portion of the device region extends laterally from the first source/drain region to the second source/drain region;

a gate region disposed in the device region, wherein the gate region adjoins a side of the first portion of the device region laterally between the first source/drain region and the second source/drain region; and a plate disposed over the semiconductor substrate, wherein:

the plate comprises a first doped region, a second doped region, and a third doped region;

the first doped region and the third doped region have a first doping type;

the second doped region has a second doping type opposite the first doping type;

the second doped region is disposed between the first doped region and the third doped region; and the second doped region overlies a first section of the first portion of the device region.

11. The semiconductor device of claim 10, wherein the plate has more than four outer sidewalls.

12. The semiconductor device of claim 10, wherein:

the plate comprises a central portion that overlies the first portion of the device region;

the plate comprises a peripheral portion that protrudes from the central portion toward the first sidewall of the isolation structure;

the second doped region is disposed in the central portion; and the first doped region is disposed in the peripheral portion.

13. The semiconductor device of claim 12, wherein:

the first doped region is disposed in both the peripheral portion and the central portion.

14. The semiconductor device of claim 13, wherein:

the second doped region is disposed in both the peripheral portion and the central portion.

15. The semiconductor device of claim 12, wherein:

the second doped region is disposed in both the peripheral portion and the central portion.

16. The semiconductor device of claim 12, wherein the first source/drain region comprises:

a second side of the first source/drain region that is opposite the first side of the first source/drain region, wherein the first side of the first source/drain region is laterally spaced from the second side of the first source/drain region in a first direction;

a third side of the first source/drain region; and a fourth side of the first source/drain region that is opposite the third side of the first source/drain region, wherein the fourth side of the first source/drain region is laterally spaced from the third side of the first source/drain region in a second direction perpendicular to the first direction, and wherein the second side, the third side, and the fourth side of the first source/drain region are spaced from the isolation structure.

17. The semiconductor device of claim 16, wherein:

the peripheral portion of the plate overlies a second portion of the device region and a portion of the isolation structure; and the second portion of the device region is disposed on the third side of the first source/drain region.

18. The semiconductor device of claim 17, wherein the second portion of the device region extends from the first sidewall of the isolation structure laterally in the first direction along a second sidewall of the isolation structure toward the gate region.

19. The semiconductor device of claim 18, wherein the gate region comprises:

a first side of the gate region facing the second sidewall of the isolation structure;

a second side of the gate region that is opposite the first side of the gate region, wherein the second side of the gate region is laterally spaced from the first side of the gate region in the second direction;

a third side of the gate region; and a fourth side of the gate region, wherein the fourth side of the gate region is laterally spaced from the third side of the gate region in the first direction, and wherein the second side, the third side, and the fourth side of the gate region are spaced from the isolation structure.

20. The semiconductor device of claim 19, wherein the peripheral portion of the plate overlies at least a portion of the second sidewall of the isolation structure and overlies at least a portion of the first sidewall of the isolation structure.

* * * * *